US011711107B2

(12) United States Patent
Iversen et al.

(10) Patent No.: US 11,711,107 B2
(45) Date of Patent: Jul. 25, 2023

(54) SYSTEMS AND METHODS FOR ANTENNA IMPEDANCE MATCHING

(71) Applicant: Qorvo US, Inc., Greensboro, NC (US)

(72) Inventors: Christian Rye Iversen, Vestbjerg (DK); Eric K. Bolton, Kernersville, NC (US); David Edward Reed, Calhan, CO (US); Ryan Lee Bunch, Colfax, NC (US)

(73) Assignee: Qorvo US, Inc., Greensboro, NC (US)

( * ) Notice: Subject to any disclaimer, the term of this patent is extended or adjusted under 35 U.S.C. 154(b) by 56 days.

(21) Appl. No.: 17/454,437

(22) Filed: Nov. 10, 2021

(65) Prior Publication Data

US 2022/0149879 A1 May 12, 2022

Related U.S. Application Data

(60) Provisional application No. 63/111,659, filed on Nov. 10, 2020.

(51) Int. Cl.
*H04B 1/04* (2006.01)
*H04B 1/16* (2006.01)
*H04B 1/18* (2006.01)
*H03H 7/38* (2006.01)
(Continued)

(52) U.S. Cl.
CPC ............. *H04B 1/18* (2013.01); *H03H 7/38* (2013.01); *H04B 1/04* (2013.01); *H04B 1/1607* (2013.01)

(58) Field of Classification Search
None
See application file for complete search history.

(56) References Cited

U.S. PATENT DOCUMENTS

| 4,095,186 A | 6/1978 | Vesel |
| 5,187,719 A | 2/1993 | Birgenheier et al. |
| 6,859,761 B2 | 2/2005 | Bensky et al. |

(Continued)

OTHER PUBLICATIONS

Yeo, K.S. et al., "Non-sequential linear CMOS phase detector for CDR applications," IEEE Proceedings-Circuits, Devices and Systems, vol. 152, No. 6, Dec. 2005, pp. 667-672.
(Continued)

*Primary Examiner* — Pablo N Tran
(74) *Attorney, Agent, or Firm* — Withrow & Terranova, P.L.L.C.

(57) ABSTRACT

Systems and methods for antenna impedance matching provide an integrated circuit (IC) configured to be placed proximate an antenna that includes a sensor based on a coupler having forward and reverse power detectors for detecting an impedance at the antenna and provides dynamic impedance matching. Further, exemplary aspects of the present disclosure contemplate using a single wire bus capable of supplying power and providing a bidirectional serial communication link to allow communication between the IC of the present disclosure and a control circuit (e.g., a bridge or transceiver). Further aspects of the present disclosure contemplate providing systems and methods for calibrating the IC at production. Further, the accuracy of the impedance sensor may be dependent on accurate determination of power and phase difference between forward and reverse coupled signals, and a system for removing an offset between the forward and reverse power detectors is disclosed.

20 Claims, 17 Drawing Sheets

(51) Int. Cl.
*H04B 1/38* (2015.01)
*H01Q 23/00* (2006.01)

(56) References Cited

U.S. PATENT DOCUMENTS

| | | |
|---|---|---|
| 8,737,929 B2 | 5/2014 | Cohen et al. |
| 8,869,612 B2 * | 10/2014 | Chen ................ G01F 23/284 |
| | | 73/304 C |
| 9,225,507 B1 | 12/2015 | Lye et al. |
| 9,392,558 B2 * | 7/2016 | See .................... H04W 52/367 |
| 9,793,610 B2 | 10/2017 | Wehrmann et al. |
| 10,056,888 B2 | 8/2018 | Iversen |
| 10,599,601 B1 | 3/2020 | Ngo et al. |
| 10,680,574 B1 * | 6/2020 | Hrivnak ............... H04B 1/0458 |
| 2007/0296396 A1 | 12/2007 | Nakahira |
| 2012/0232471 A1 * | 9/2012 | Chen .................. A61M 1/1605 |
| | | 604/82 |
| 2016/0226429 A1 | 8/2016 | Lee |
| 2021/0218430 A1 * | 7/2021 | Han ........................ H04B 1/38 |
| 2021/0407771 A1 * | 12/2021 | Funk ................. H01J 37/32174 |

OTHER PUBLICATIONS

Notice of Allowance for U.S. Appl. No. 15/431,933, dated Apr. 27, 2018, 9 pages.

\* cited by examiner

SYSTEMS AND METHODS FOR ANTENNA IMPEDANCE MATCHING

PRIORITY CLAIM

The present application claims priority to U.S. Patent Application Ser. No. 63/111,659 filed on Nov. 10, 2020 and entitled "ANTENNA IMPEDANCE SENSING CONCEPTS," the contents of which is incorporated herein by reference in its entirety.

BACKGROUND

I. Field of the Disclosure

The technology of the disclosure relates generally to antennas for wireless transmission and reception and more particularly, to ways to improve impedance matching for the antennas in dynamic environments.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to improve wireless bandwidth so more data may be sent from and received by the mobile communication devices. Responsive to such demands, cellular standards have evolved and moved into higher frequencies. For example, the Fifth Generation-New Radio (5G-NR) standard has frequencies in the gigahertz range.

In general, to achieve optimal antenna performance in wireless communication, an impedance of an antenna is matched to an impedance of the line conveying a signal to be transmitted. As the frequencies have increased, the antennas associated with the mobile communication devices have become more sensitive. Accordingly, when there are changes in the environment (e.g., proximity to organic material (e.g., proximity to a user's hand, head, or body) or being placed on a metal surface) a change in the impedance of the antenna caused by such environmental change may have a disproportionate impact on performance due to an impedance mismatch. Minimizing the impact of such dynamic impedance variations has proven challenging and there remains room for improving impedance matching in dynamic environments.

SUMMARY

Aspects disclosed in the detailed description include systems and methods for antenna impedance matching. In particular, exemplary aspects of the present disclosure provide an integrated circuit (IC) configured to be placed proximate an antenna that includes a sensor based on a coupler having forward and reverse power detectors for detecting an impedance at the antenna and provides dynamic impedance matching. Further, exemplary aspects of the present disclosure contemplate using a single-wire bus capable of supplying power and providing a bidirectional serial communication link to allow communication between the IC of the present disclosure and a control circuit (e.g., a bridge or transceiver). Further aspects of the present disclosure contemplate providing systems and methods for calibrating the IC at production. Further, the accuracy of the impedance sensor may be dependent on accurate determination of power and phase difference between forward and reverse coupled signals. Accordingly, exemplary aspects provide systems and methods for removing an offset between the forward and reverse power detectors. Further, an attenuator may be used with the power detectors, and this attenuator may be dynamically controlled based on signals passing through the coupler. Further, because power conservation may be a concern, exemplary aspects of the present disclosure contemplate a signal power detection process that activates the IC based on a signal lasting more than a threshold amount of time so as to avoid processing noise. In a further exemplary aspect, a counter is used to count zero crossings of a signal to determine an average signal frequency, which is used to select a coupler band and filter settings so as to optimize impedance measurement. In a further aspect, a temperature sensor is used to modify production calibration settings and/or algorithms to compensate for temperature-based variations in the circuits and sensor circuitry. In a further exemplary aspect, coupling loss within the coupler is reduced when the impedance sensor is not actively sensing by changing termination impedances for the coupler. In a further aspect, compensation for phase shifts that may be introduced by the amplifiers within the detector may be provided. In a further aspect, the impedance sensors may operate in low current mode based on whether an antenna tuner is in a low current mode. Implementation of one or more of the aspects of the present disclosure allows for improved impedance detection and compensation thereof, which in turn allows for more efficient signal transmission and reception, and provides for better user experience.

In this regard in one aspect, an impedance sensor die is disclosed. The impedance sensor die comprises a bus interface configured to be coupled to a single-wire bus that provides signaling and power to the impedance sensor die. The impedance sensor die also comprises an internal control bus. The impedance sensor die also comprises a controller coupled to the internal control bus. The impedance sensor die also comprises a dual-direction coupler coupled to the internal control bus. The dual-direction coupler comprises four ports including a forward in, a reverse in, a forward out, and a reverse out. The impedance sensor die also comprises a coupler matching circuit comprising programmable load impedances coupled to the dual-direction coupler. The impedance sensor die also comprises a calibration switch coupled to the dual-direction coupler and the internal control bus. The impedance sensor die also comprises an attenuator circuit coupled to the calibration switch and the internal control bus. The impedance sensor die also comprises a memory coupled to the controller. The impedance sensor die also comprises a power detector coupled to the internal control bus and configured to measure power for a signal from the dual-direction coupler. The impedance sensor die also comprises a phase detector coupled to the internal control bus and configured to measure a phase for the signal from the dual-direction coupler.

In another aspect, a computing device is disclosed. The computing device comprises a transmitter comprising an output. The computing device also comprises a bridge circuit coupled to the transmitter. The computing device also comprises a single-wire bus that provides signaling and power. The single-wire bus is coupled to the bridge circuit. The computing device also comprises an antenna. The computing device also comprises an impedance tuning circuit coupled to the antenna. The computing device also comprises an impedance sensor die coupled to the output of the transmitter and the impedance tuning circuit. The impedance sensor die is electrically proximate to the antenna. The impedance sensor die comprises a bus interface coupled to the single-wire bus. The impedance sensor die also comprises an internal control bus. The impedance sensor die also comprises a controller coupled to the internal control bus. The impedance sensor die also comprises a dual-direction coupler coupled to the internal control bus. The dual-direction coupler comprises four ports including a forward in, a reverse in, a forward out, and a reverse out. The impedance sensor die also comprises a power detector coupled to the internal control bus and configured to measure power for a signal from the dual-direction coupler. The impedance sensor die also comprises a phase detector coupled to the internal control bus and configured to measure a phase for the signal from the dual-direction coupler.

DETAILED DESCRIPTION

Figure 1A:
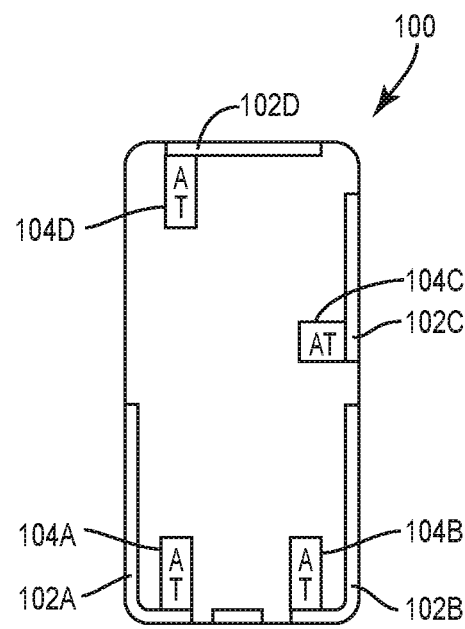
FIG. 1A is a top plan view of a mobile communication device with multiple antennas that may benefit from exemplary aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include systems and methods for antenna impedance matching. In particular, exemplary aspects of the present disclosure provide an integrated circuit (IC) configured to be placed proximate an antenna that includes a sensor based on a coupler having forward and reverse power detectors for detecting an impedance at the antenna and provides dynamic impedance matching. Further, exemplary aspects of the present disclosure contemplate using a single-wire bus capable of supplying power and providing a bidirectional serial communication link to allow communication between the IC of the present disclosure and a control circuit (e.g., a bridge or transceiver). Further aspects of the present disclosure contemplate providing systems and methods for calibrating the IC at production. Further, the accuracy of the impedance sensor may be dependent on accurate determination of power and phase difference between forward and reverse coupled signals. Accordingly, exemplary aspects provide systems and methods for removing an offset between the forward and reverse power detectors. Further, an attenuator may be used with the power detectors, and this attenuator may be dynamically controlled based on signals passing through the coupler. Further, because power conservation may be a concern, exemplary aspects of the present disclosure contemplate a signal power detection process that activates the IC based on a signal lasting more than a threshold amount of time so as to avoid processing noise. In a further exemplary aspect, a counter is used to count zero crossings of a signal to determine an average signal frequency, which is used to select a coupler band and filter settings so as to optimize impedance measurement. In a further aspect, a temperature sensor is used to modify production calibration settings and/or algorithms to compensate for temperature-based variations in the circuits and sensor circuitry. In a further exemplary aspect, coupling loss within the coupler is reduced when the impedance sensor is not actively sensing by changing termination impedances for the coupler. In a further aspect, compensation for phase shifts that may be introduced by the amplifiers within the detector may be provided. In a further aspect, the impedance sensors may operate in low current mode based on whether an antenna tuner is in a low current mode. Implementation of one or more of the aspects of the present disclosure allows for improved impedance detection and compensation thereof, which in turn allows for more efficient signal transmission and reception and provides for better user experience.

In this regard, FIG. 1A is top plan view of a mobile communication device 100 having antennas 102A-102D therein, each with a respective aperture tuner circuit 104A-104D. The antennas 102A-102D may be configured to operate optimally at different frequencies, contribute to diversity transmission/reception, or operate using different standards (e.g., 5G versus WiFi or BLUETOOTH). The antennas 102A-102D may be bipole antennas, bowtie antennas, meander antennas, F-antennas, or the like without departing from the scope of the present disclosure. Likewise, the precise position of the antennas 102A-102D within the mobile communication device 100 is not central to the present disclosure.

In practice, there are any number of environmental conditions that may affect the relative impedance of the antennas 102A-102D. A few examples are provided in FIGS. 1B-1D. For example, merely plugging in a cable 106 into a port 108 may change impedances of the antennas 102A-102D as the proximity of the pins in a connector 110 and/or the conductive elements within the cable 106 may provide inductive coupling. More dramatically, the mobile communication device 100 may be placed on a table 112. If the table 112 is metal, the entire table 112 may act as part of the antennas 102A-102D, thereby changing antenna impedance. Even if the table 112 is plastic or wood, such materials have a different dielectric coefficient than air and thus may change the impedance of the antennas 102A-102D. More commonly, a person may hold the mobile communication device 100 next to their head 114 or at least in their hand 116. Again, the dielectric constants of flesh are different than those of air and may change the impedance of the antennas 102A-102D.

When there is an impedance mismatch at the antennas 102A-102D, there may be signal reflection at the antennas 102A-102D and/or some portion of the signal power may not be transmitted by the antennas 102A-102D resulting in reduced performance, diminished user experience, and/or accelerated battery draining. While the aperture tuner circuits 104A-104D may be used to help perform impedance matching, commercially available solutions (as of this writing) may not determine the proper antenna impedance, resulting in improper tuning and continued performance degradation.

Figure 2:
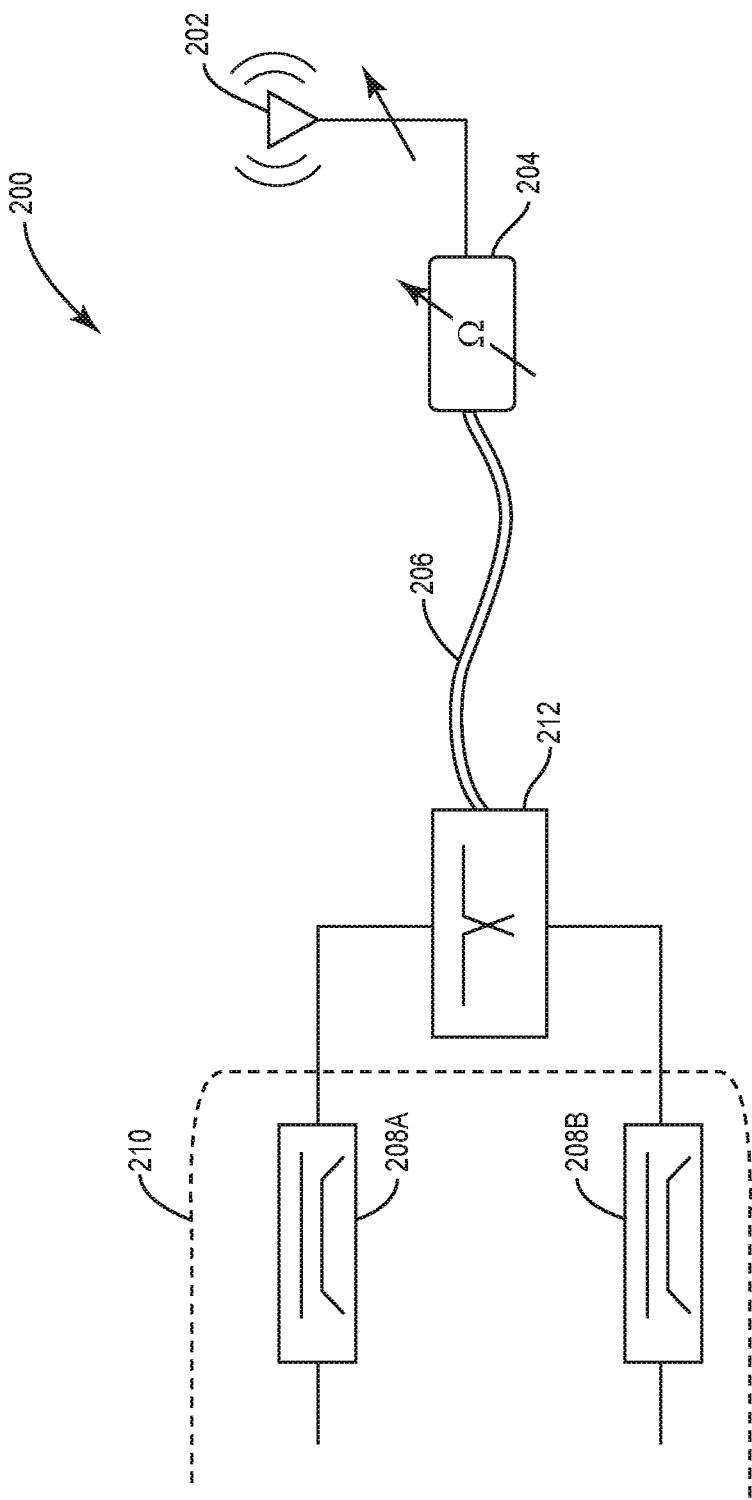
FIG. 2 provides a block diagram of a conventional impedance matching approach.

Part of the reason that existing solutions may not tune the antenna properly is the positioning of the sensing circuitry as better illustrated in FIG. 2. That is, within a mobile communication device 200 having an antenna 202 with an impedance tuner circuit 204, a cable 206 capable of carrying radio frequency (RF) signals may separate the impedance tuner circuit 204 from couplers 208A-208B within an integrated power amplifier module 210. The impedance tuner circuit 204 may be an aperture tuner or other tuning circuit. Additionally, filtering circuits 212 may be interposed between the couplers 208A-208B and the impedance tuner circuit 204. The result of this physical and electrical distance between the tuner circuit 204 and the couplers 208A-208B means that measurements taken at the couplers 208A-208B may not accurately represent the reflections taking place at the antenna 202 and thus may not be accurately measuring impedance mismatches at the antenna 202. Such inaccurate measurements may result in inaccurate tuning of the impedance tuner circuit 204 such that some impedance mismatch remains.

Exemplary aspects of the present disclosure provide myriad solutions to improve impedance matching for antennas. A first exemplary aspect is changing the position of a coupler used to measure signals at the antenna so that a more accurate measurement of reflected signals may be made. Various other ways to improve measurements or improve adjustments to tuning circuits are also provided.

Figure 3:
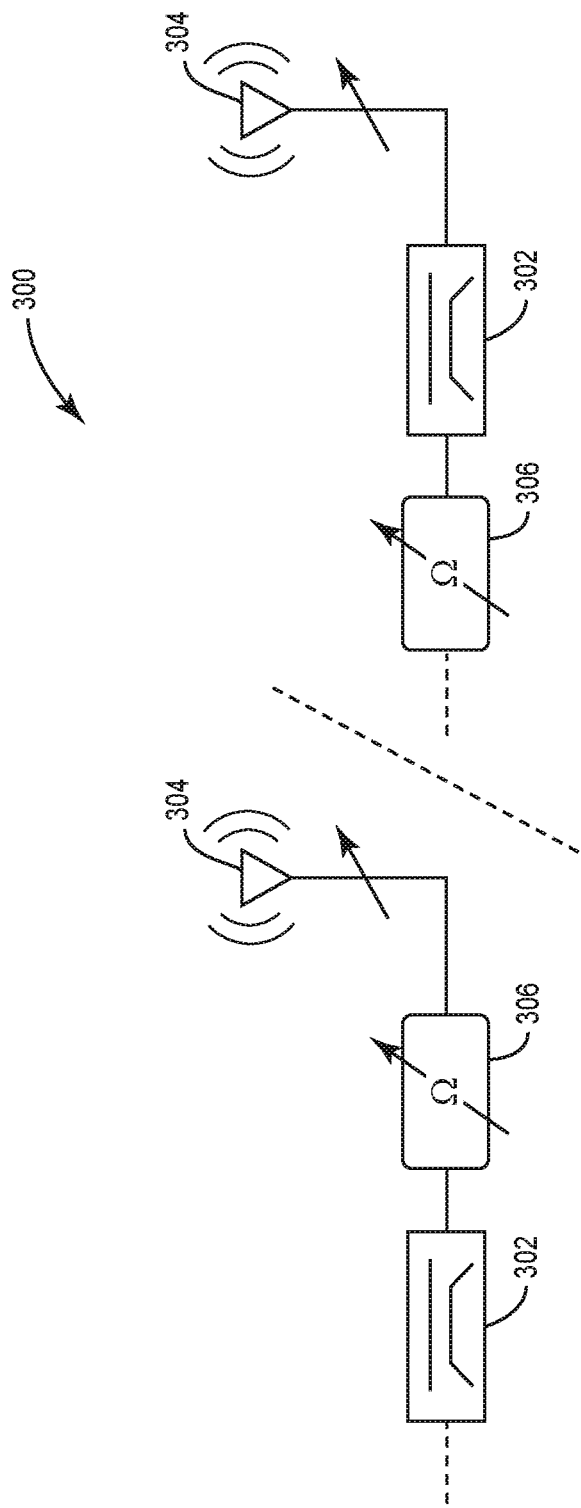
FIG. 3 provides a block diagram of an improved impedance matching circuit placement according to an exemplary aspect of the present disclosure.

In this regard, a first exemplary aspect is illustrated in FIG. 3, where a mobile communication device 300 positions a coupler 302 proximate an antenna 304 without an RF cable positioned between the coupler 302 and the antenna 304. In a first exemplary aspect, the coupler 302 may be positioned immediately adjacent to the antenna 304. In a second exemplary aspect, the coupler 302 may be positioned such that an impedance tuning circuit 306 is positioned between the coupler 302 and the antenna 304. Either of these positions allows for improved measurements, which allows for improved antenna matching in use cases.

Figure 4:
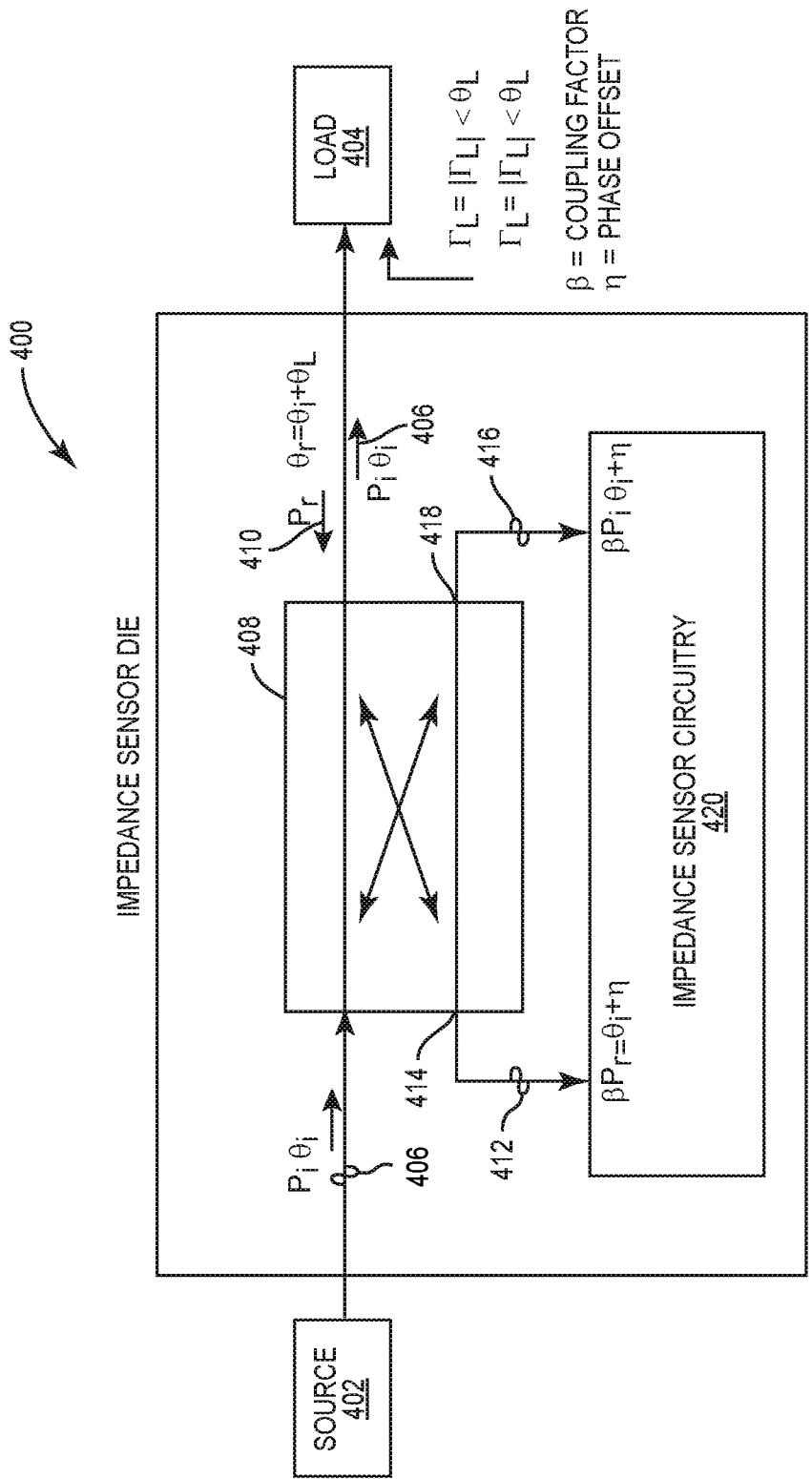
FIG. 4 is a block diagram of an exemplary impedance sensor die that contemplates an ideal coupler with impedance sensor circuitry.

A more detailed view of an exemplary ideal coupler according to aspects of the present disclosure is provided with reference to FIG. 4. In this regard, an impedance sensor die 400 is illustrated coupled to a source 402 and a load 404. A signal 406 having a power $P_i$ and a phase $\theta_i$ is sent from the source 402 into an ideal coupler 408 within the impedance sensor die 400. The signal 406 passes from the ideal coupler 408 to the load 404 where some portion of the signal 406 is reflected as signal 410 having a power $P_r$ and a phase $\theta_r = \theta_i + \theta_L$. The reflection is based on a complex reflection coefficient $\Gamma_L$. The ideal coupler 408 has a coupling factor $\beta$ and a phase offset $\eta$ such that a signal 412 from a third port 414 of the ideal coupler 408 is $\beta P_r \theta_r + \eta$ and a signal 416 from a fourth port 418 of the ideal coupler 408 is $\beta P_i \theta_i + \eta$. Impedance sensor circuitry 420 analyzes signals 412 and 416 to determine an appropriate impedance match. The ideal coupler 408 assumes that there is no attenuation through the ideal coupler 408.

Figure 5:
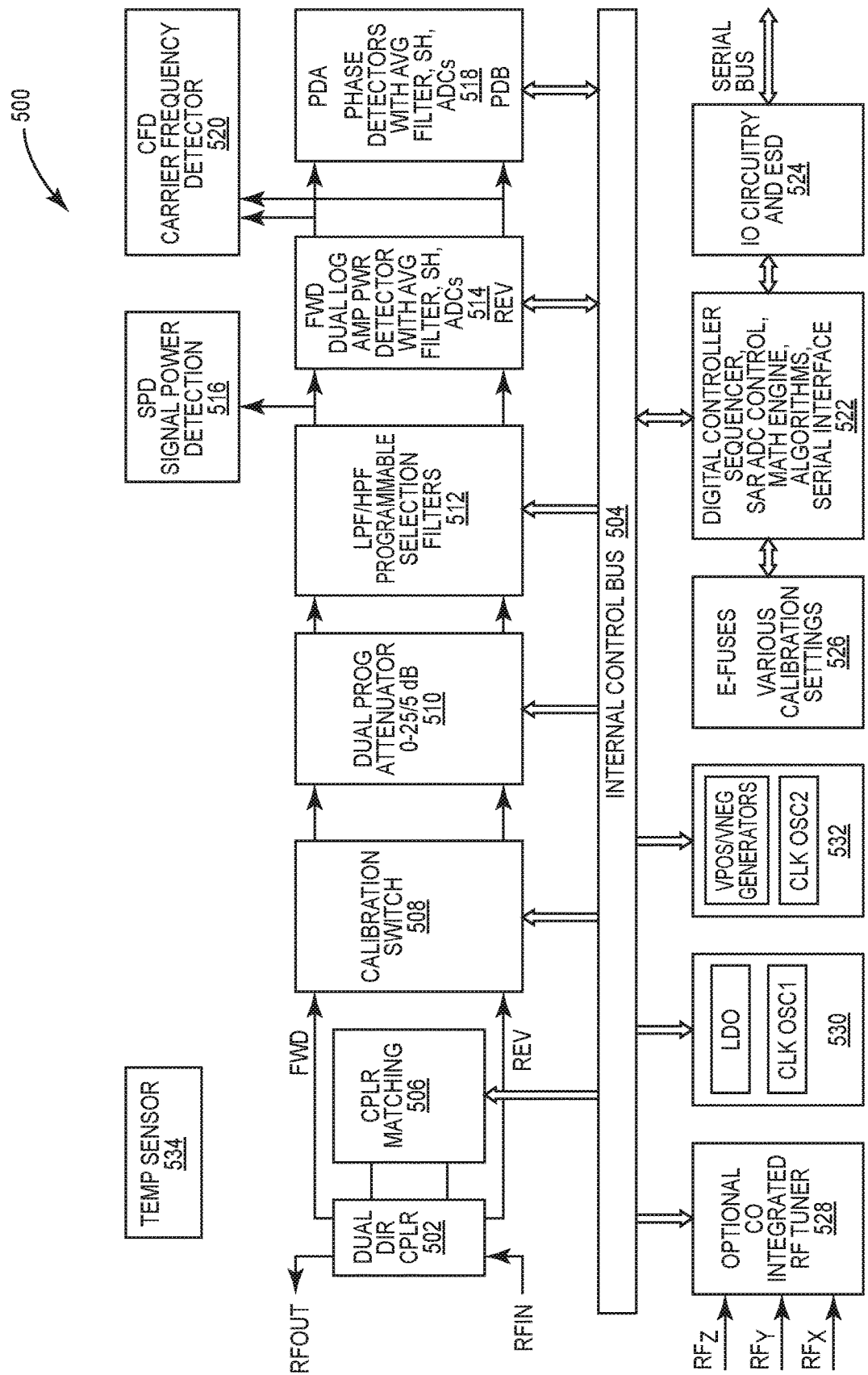
FIG. 5 is a block diagram of an impedance sensor die implementing various aspects of the present disclosure for use with the mobile communication device of FIG. 1.

More realistically, any coupler used to measure signals 406 and 410 will have various other frequency dependent functions acting thereon. Accordingly, as illustrated in FIG. 5, exemplary aspects of the present disclosure contemplate an impedance sensor die 500 that includes a dual-direction coupler 502 which is coupled to an internal control bus 504 through a coupler matching circuit 506. The dual-direction coupler 502 senses a transmission path between a source generator and a load impedance (e.g., a radio transceiver and antenna, respectively). That is, the dual-direction coupler 502 senses forward and reverse traveling wave components in the signal path. The dual-direction coupler 502 may provide output signals that are proportional to forward and reverse traveling wave components. The coupler matching circuit 506 is configured to be calibrated for optimum coupler directivity. This calibration may be done in production tests of the bands in operation. Such coupler termination settings may be stored in memory (e.g., non-volatile) (see fuse circuit 526 described below) in the impedance sensor die 500.

Additionally, the impedance sensor die 500 includes a calibration switch 508 that receives signals from the dual-direction coupler 502 and passes signals to a dual programmable attenuator circuit 510. The calibration switch 508 also allows runtime auto zeroing of power and phase detectors (see below) at a carrier frequency. The dual programmable attenuator circuit 510 passes signals to a programmable (low pass/high pass (e.g., LPF/HPF)) selection filter circuit 512. The dual programmable attenuator circuit 510 also allows scaling the input level to be within the operating power range of the power detectors. The attenuator setting is determined based on a power measurement prior to the actual impedance measurement. The programmable selection filter circuit 512 passes signals to a power detector circuit 514 and a signal power detection (SPD) circuit 516. The programmable selection filter circuit 512 also allows for rejection of out-of-band interfering signals. The SPD circuit 516 enables low current triggered modes of measurement. That is, the SPD circuit 516 may monitor forward direction RF power levels and wake up the other portions of the impedance sensor die 500 once RF power is available. The power detector circuit 514 passes signals to a phase detector circuit 518 and a carrier frequency detector circuit 520, The power detector circuit 514 may have programmable averaging filters, analog-to-digital converters (ADCs), and sample and hold (SH) circuitry that enable estimation of the power differences between forward and reverse coupled signals. Programmable averaging filters allow for a wide variety of modulated carrier signals. The phase detector circuit 518 may include programmable averaging filters, SH circuitry, and ADCs that enable estimation of the phase difference between forward and reverse coupled signals. Programmable averaging filters allow for a wide variety of modulated carrier signals. The carrier frequency detector circuit 520 may enable frequency estimation of the forward and reverse coupled signals. This frequency information can be used in automatic configuration of the part, frequency correction, and interferer/blocking signal detection.

The internal control bus 504 is also coupled to the calibration switch 508, the dual programmable attenuator circuit 510, the programmable selection filter circuit 512, the power detector circuit 514, and the phase detector circuit 518. Additionally, the internal control bus 504 may be coupled to a controller or control circuit 522. The control circuit 522 may be coupled to input/output (I/O) circuitry 524. The control circuit 522 may be a digital circuit for sequencing and control of the various other elements in the impedance sensor die 500, may include a math engine for mathematical computations and algorithm execution, and various serial interface functions. The I/O circuitry 524 may act as a bus interface and may include electrostatic discharge protection (ESD) elements. The control circuit 522 may further be coupled to a fuse circuit 526, which may assist in enabling various calibration settings. In an exemplary aspect, the control circuit 522 may output a control signal through the I/O circuitry 524 to control an impedance tuning circuit.

The internal control bus 504 may further be coupled to an optional integrated tuner 528, a first oscillator 530, and a second oscillator 532. The first oscillator 530 may be or include a low drop out (LDO) oscillator. The second oscillator 532 may be or include positive and negative voltage generators. The integrated tuner 528 may be an RF antenna tuner and may be used for impedance matching as explained in greater detail below. The oscillators 530, 532 may be production test calibrated for accurate timing.

While no connection is shown, it should be appreciated that a temperature sensor 534 may be included in the impedance sensor die 500 and may provide information related to a sensed temperature to the control circuit 522. As explained in greater detail below, this may allow for temperature correction of the dual-direction coupler 502 and other parts of the impedance sensor die 500.

The impedance sensor die 500 provides a single die that includes all circuitry and functionality to detect and estimate a complex reflection coefficient of load impedance. By design, the impedance sensor die 500 may be positioned proximate the antenna of the mobile computing device to allow for more accurate measurements. Additionally, the impedance sensor die 500 may allow for the estimation of the complex reflection coefficient over a serial interface in polar notation as a magnitude component and a phase component. Inclusion of the calibration switch 508 may allow for production test calibration and runtime self-calibration processes to provide an improved estimation of the complex reflection coefficient.

Having provided the overall architecture, a more detailed exploration of the various elements of the impedance sensor die 500 and how these elements interoperate with elements of a mobile communication device are now discussed in the following paragraphs.

Figure 6:
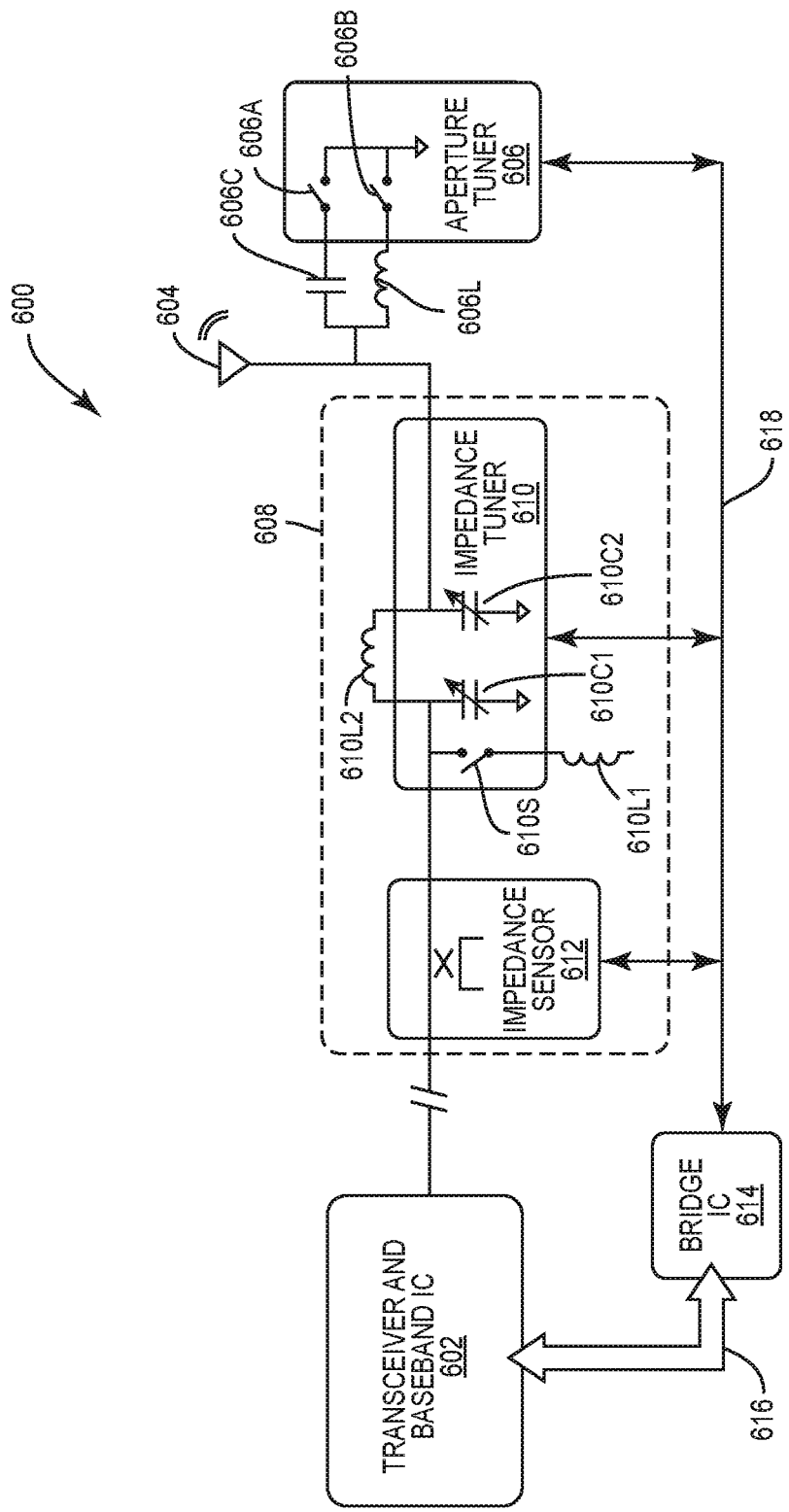
FIG. 6 is a block diagram of an exemplary aspect of the present disclosure, where control of an impedance sensor die is located in a transceiver circuit.

More specifically, as illustrated in FIG. 6, a mobile communication device 600 may include a transceiver and baseband IC 602 that transmits and receives signals through an antenna 604. It should be appreciated that the antenna 604 may be an antenna array, multiple antennas for diversity transmission/reception, or the like. The antenna 604 may have an associated aperture tuner 606, which may include active elements such as a capacitor 606C and an inductor 606L as well as switches 606A, 606B to assist in the tuning provided by the aperture tuner 606. An impedance sensor circuit 608 may be associated with the antenna 604. The impedance sensor circuit 608 may include an impedance tuner circuit 610 and an impedance sensor die 612. The impedance tuner circuit 610 may include active elements such as inductors 610L1, 610L2, variable capacitors 610C1, 610C2, and a switch 610S.

The impedance sensor die 612 may be the impedance sensor die 500 of FIG. 5. A bridge IC 614 may be coupled to the transceiver and baseband IC 602 through a radio frequency front end (RFFE) bus 616. The RFFE bus 616 may comply with the RFFE standard set forth by MIPI. The bridge IC 614 may communicate with the impedance sensor die 612, the impedance tuner circuit 610, and the aperture tuner 606 through a single-wire supply and bidirectional serial bus 618. Commands from the transceiver and baseband IC 602 are translated by the bridge IC 614. More information about such a bus may be found in U.S. Pat. No. 10,599,601, which is incorporated herein by reference in its entirety. While both an impedance tuner circuit 610 and an aperture tuner 606 are illustrated, it should be appreciated that exemplary aspects of the present disclosure may omit one or the other of these tuners.

As noted above, the impedance sensor die 612 may be placed in close proximity to the antenna feedpoint and can possibly be integrated on the same die. The aperture tuner 606 and/or the impedance tuner circuit 610 may be placed on the antenna structure proper. Further, the bridge IC 614 may control multiple antenna tuning systems (not shown), It is also possible to multiplex signals for the bus 618 and RF transmission on the same line.

Figure 7:
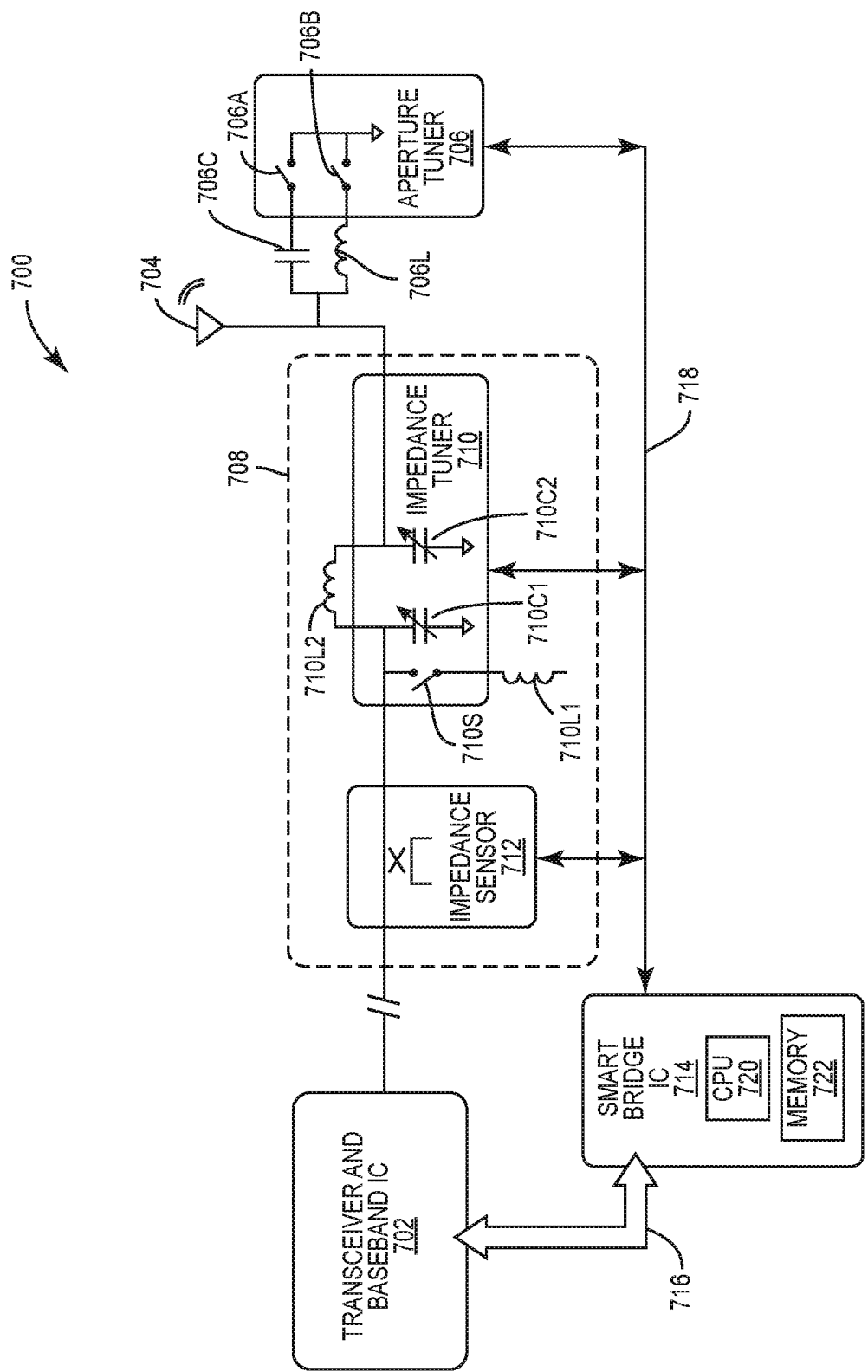
FIG. 7 is a block diagram of an exemplary aspect of the present disclosure, where control of an impedance sensor die is located in a smart bridge circuit.

Alternatively, control of the tuning elements may be moved into a bridge IC. For example, as better illustrated in FIG. 7, a mobile communication device 700 may include a transceiver and baseband IC 702 that transmits and receives signals through an antenna 704. It should be appreciated that the antenna 704 may be an antenna array, multiple antennas for diversity transmission/reception, or the like. The antenna 704 may have an associated aperture tuner 706, which may include active elements such as a capacitor 706C and an inductor 7061, as well as switches 706A, 706B to assist in the tuning provided by the aperture tuner 706. An impedance sensor circuit 708 may be associated with the antenna 704. The impedance sensor circuit 708 may include an impedance tuner circuit 710 and an impedance sensor die 712. The impedance tuner circuit 710 may include active elements such as inductors 710L1, 710L2, variable capacitors 710C1, 710C2, and a switch 710S.

The impedance sensor die 712 may be the impedance sensor die 500 of FIG. 5. A smart bridge IC 714 may be coupled to the transceiver and baseband IC 702 through an RFFE bus 716. The smart bridge IC 714 may communicate with the impedance sensor die 712, the impedance tuner circuit 710, and the aperture tuner 706 through a single-wire supply and bidirectional serial bus 718. Instead of relying on commands from the transceiver and baseband IC 702, the smart bridge IC 714 may include a control circuit 720 (also referred to as a CPU) and memory 722 able to control the impedance tuning. In this aspect, intervention from the transceiver and baseband IC 702 is minimal, but some information such as timing, frequency, and the like may be provided to the smart bridge IC 714. It is also possible that the SPD circuit 516 and carrier frequency detector circuit 520 of the impedance sensor die 712 may provide this information to the smart bridge IC 714.

Figure 8:
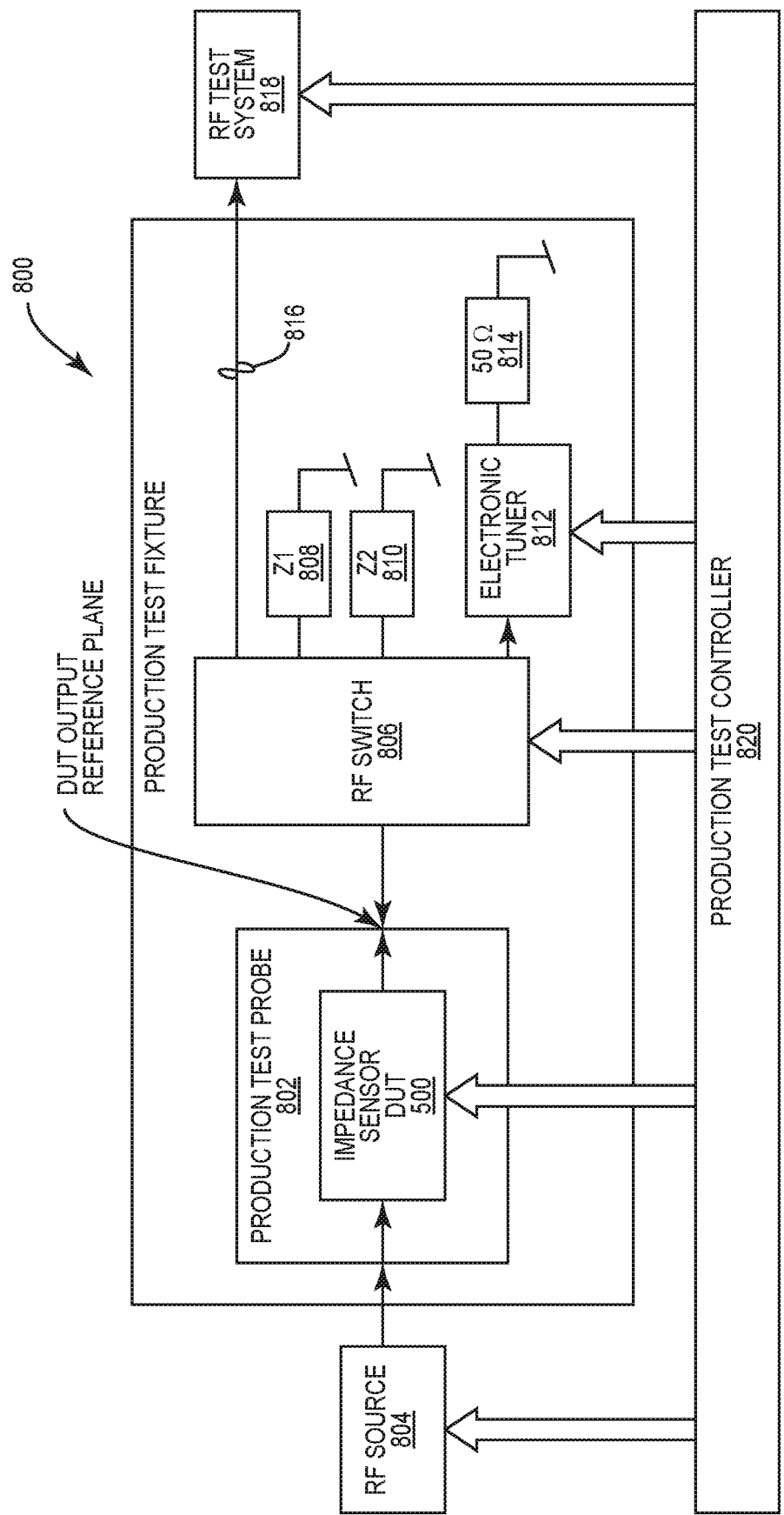
FIG. 8 is a block diagram of a system to perform production calibration measurements to be stored in the impedance sensor die.

FIG. 8 provides a block diagram of a calibration system 800 used during production to test the impedance sensor die 500. As noted above, in the impedance sensor die 500, a dual-direction coupler 502 is used as a primary sensing device. The dual-direction coupler 502 provides a forward coupled signal (FWD) and a reverse coupled signal (REV). FWD and REV are proportional to the forward and reverse traveling wave components in the transmission path. By providing FWD and REV to appropriate circuitry, an estimation of power and phase offsets may be made. More detail on this is provided below. These estimates may be converted to a digital domain for calculation of the load reflection coefficient ($\Gamma_L$). The dual-direction coupler 502 has ports, FWDTERM and REVTERM (not shown in FIG. 8), that may be terminated in programmable load impedances within the coupler matching circuit 506. The ability of the dual-direction coupler 502 to discriminate the forward and reverse traveling wave components is quantified as the directivity, expressed in decibels. The directivity plays a major role in the accuracy of the impedance estimation. To enable calibration of the dual-direction coupler 502, the load impedances that terminate the FWDTERM and REVTERM ports may be programmable. One way the terminations are implemented is through parallel resistor (RTERM) and capacitor (CTERM) banks that are switched in and out.

It should be appreciated that the dual-direction coupler 502 may be implemented during a back-end-of-line (BEOL) silicon process. Due to variation in material properties and variations in fabrication processing, the performance of the dual-direction coupler 502 may vary from device to device. Likewise, devices used in RTERM and CTERM may also vary from device to device. Accordingly, it may be appropriate to calibrate each device separately and store optimum RTERM and CTERM settings in nonvolatile memory (such as efuses 526) during a production test.

In theory, directivity calibration may be performed by applying an accurate load impedance that equals a characteristic impedance for the device under test (DUT) output reference plane. This load impedance may be, for example, fifty ohms (50Ω). At the input of the DUT, an RF signal is applied at a frequency of interest. Per definition, the characteristic load impedance should not cause any reflections, and, for an ideal coupler with infinite directivity, the measured signal power of the REV signal should be zero. Such ideal couplers do not readily exist, and accordingly, a small amount of REV signal power should be measured. To calibrate to DUT, the directivity RTERM, CTERM state space is searched to find an RTERM and CTERM state that maximizes the difference between signal power measured in the FWD path and the REV path.

Accordingly, the calibration system 800 may be used. In particular, the impedance sensor die 500 is a device under test (DUT) that is coupled to a production test probe 802 while receiving an RF signal from an RF source 804. The production test probe 802 may be, for example, a membrane probe. The impedance sensor die 500 provides an output signal to an RF switch 806. The RF switch 806 may be coupled to selectable impedances 808 (Z1), 810 (Z2) corresponding to the RTERM and CTERM state space. An electronic tuner 812 may also be coupled to a characteristic load impedance 814 (e.g., 50Ω). The RF switch 806 may further provide an output signal 816 to an RF test system 818. The RF test system 818 is used for measuring parameters like insertion loss, harmonics, and linearity. A production test controller 820 may control various elements during the calibration testing.

The production test controller 820 may use various search algorithms to search the RTERM, CTERM state space. For example, the search algorithm could be a global search or a gradient search. The directivity calibration may be repeated in a number of sub-bands to optimize directivity versus frequency. RTERM and CTERM states that are found to optimize the directivity may be stored in the efuses 526 for later use during operation. Using symmetry in both the dual-direction coupler 502 and the termination design, it may be possible to ensure that forward and reverse directivity are calibrated at the same time.

To assist in achieving an accurately calibrated coupler directivity, an accurate load impedance should be presented at the DUT reference plane. While it can be difficult to provide an accurate load impedance due to mismatches in the RE switch 806, the production test fixture, and the production test probe 802, exemplary aspects of the present disclosure use the electronic tuner 812 placed between the RF switch 806 and the characteristic load impedance 814. For each calibration frequency, the production test controller 820 finds the state of the electronic tuner 812 that optimizes the 50Ω match presented at the DUT output reference plane. Accordingly, the calibration process may proceed relatively confident that the calibrations are made relative to the appropriate characteristic load impedance.

It should further be appreciated that impedance sensor accuracy is dependent on accurate determination of power and phase differences between the FWD and REV signals. Accordingly, exemplary aspects of the present disclosure use the calibration switch 508 to assist in removing offsets between the FWD and REV power detectors. Before addressing the switching scheme of the present disclosure, an explanation of the origin of these offsets is provided. Specifically, despite careful design and chip layout, offsets may naturally occur between the FWD and REV power detectors due to unavoidable device mismatches. In addition, these offsets are not constant and may vary with temperature, supply voltage, and carrier frequency and level. To remove power detector offset, a calibration measurement is carried out right before the actual impedance measurement using the carrier signal. This approach provides a calibration signal at the correct carrier frequency without the need of generating the calibration signal on chip. Further, this approach minimizes the effect of time varying offset.

To facilitate calibration measurement being carried out right before the actual impedance measurement, calibration switch 508 is used. During the calibration measurement, the calibration switch 508 routes the FWD coupled signal into both receiving paths that can be used as a reference signal having equal amplitude and zero phase difference in both receiver paths. A power measurement is then performed and the difference in the ADC results from the FWD and REV detectors is stored as an offset to be used in correcting the following actual impedance measurement.

Figure 9:
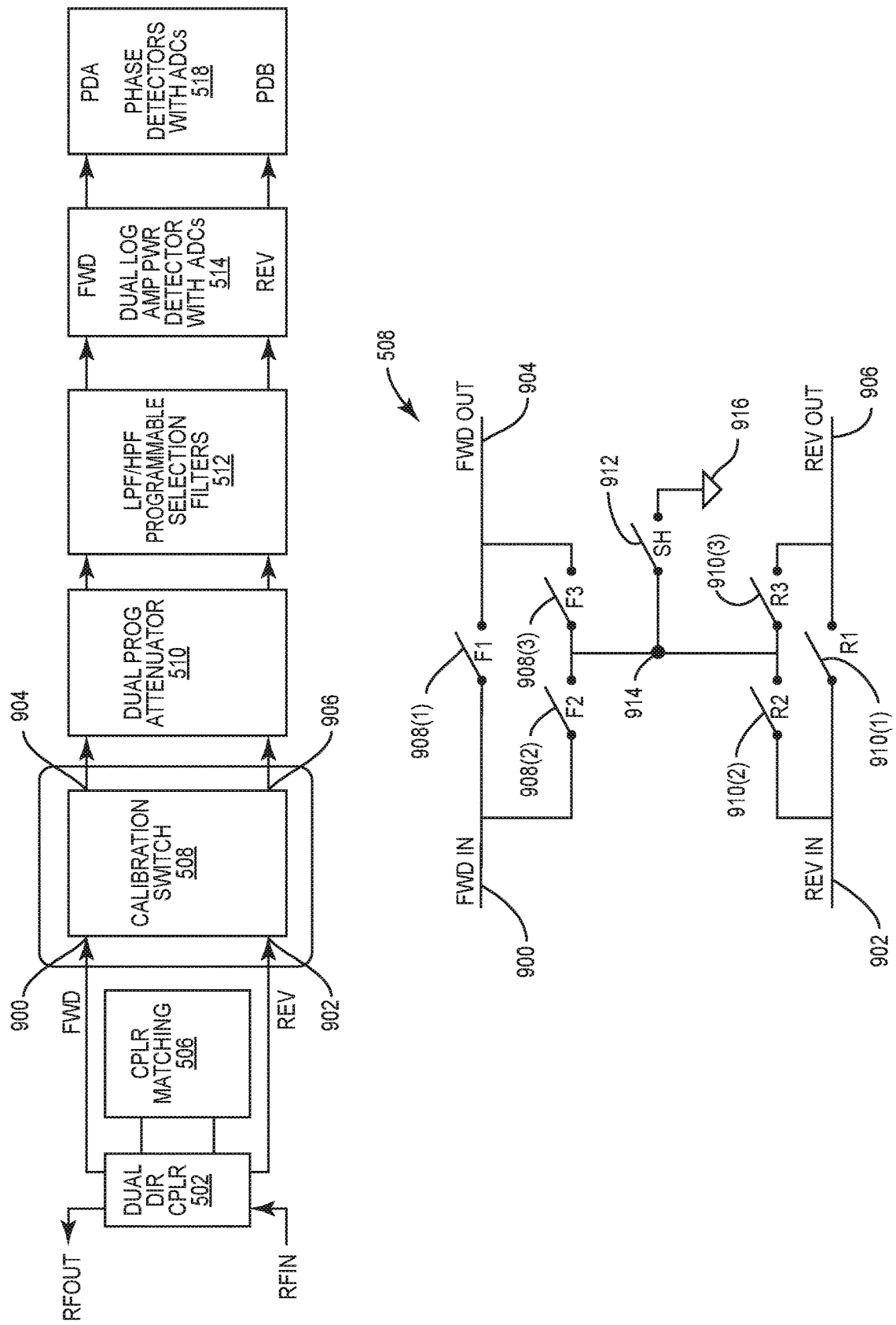
FIG. 9 is a circuit diagram of a calibration switch within the impedance sensor die.

In this regard, FIG. 9 illustrates the switch path of the calibration switch 508. The calibration switch may have a FWD input 900 and a REV input 902. The calibration switch 508 also has a FWD output 904 and a REV output 906. Further, the calibration switch 508 has forward switches 908(1)-908(3) and reverse switches 910(1)-910(3). Still further, a shunt switch 912 may selectively couple a node 914 to ground 916.

Given the structure set forth in FIG. 9, the FWD coupled signal is coupled into both receiving paths by turning switches 908(2), 908(3), and 910(3) on, with the remaining switches off. This switch arrangement allows a signal at the FWD input 900 to travel across switches 908(2), 908(3) to the FWD output 904, and likewise, the forward signal passes from the FWD input 900 across switches 908(2), 910(3) to the REV output 906.

When an actual impedance measurement is carried out with the calibration switch 508 in a normal operation mode, switches 908(1), 910(1), 912 are on, with the remaining switches off. Signals at the FWD input 900 travel directly to the FWD output 904, and signals at the REV input 902 travel directly to the REV output 906.

In a calibration mode, the signal power measured by the power detectors is approximately 4.5 dB lower than the measured forward power in normal mode on the same carrier signal. This loss is due to signal splitting and mismatch. Therefore, the offset is determined about 4.5 dB below the measured FWD signal. If the power detector is not completely linear, this offset can lead to a slight error. In measurement cases where the attenuator state is above 4.5 dB losses, the attenuator loss can be reduced to about 4.5 dB during the calibration measurement as this would then measure the offset close to the same power level as the FWD signal. The measurement cases that require the best accuracy in power measurements are highly reflective loads where FWD and REV are close in power. If the attenuator change during calibration measurement is implemented, this implementation will bring the calibration measurement power levels close to actual measurement power levels for best accuracy.

Figure 10:
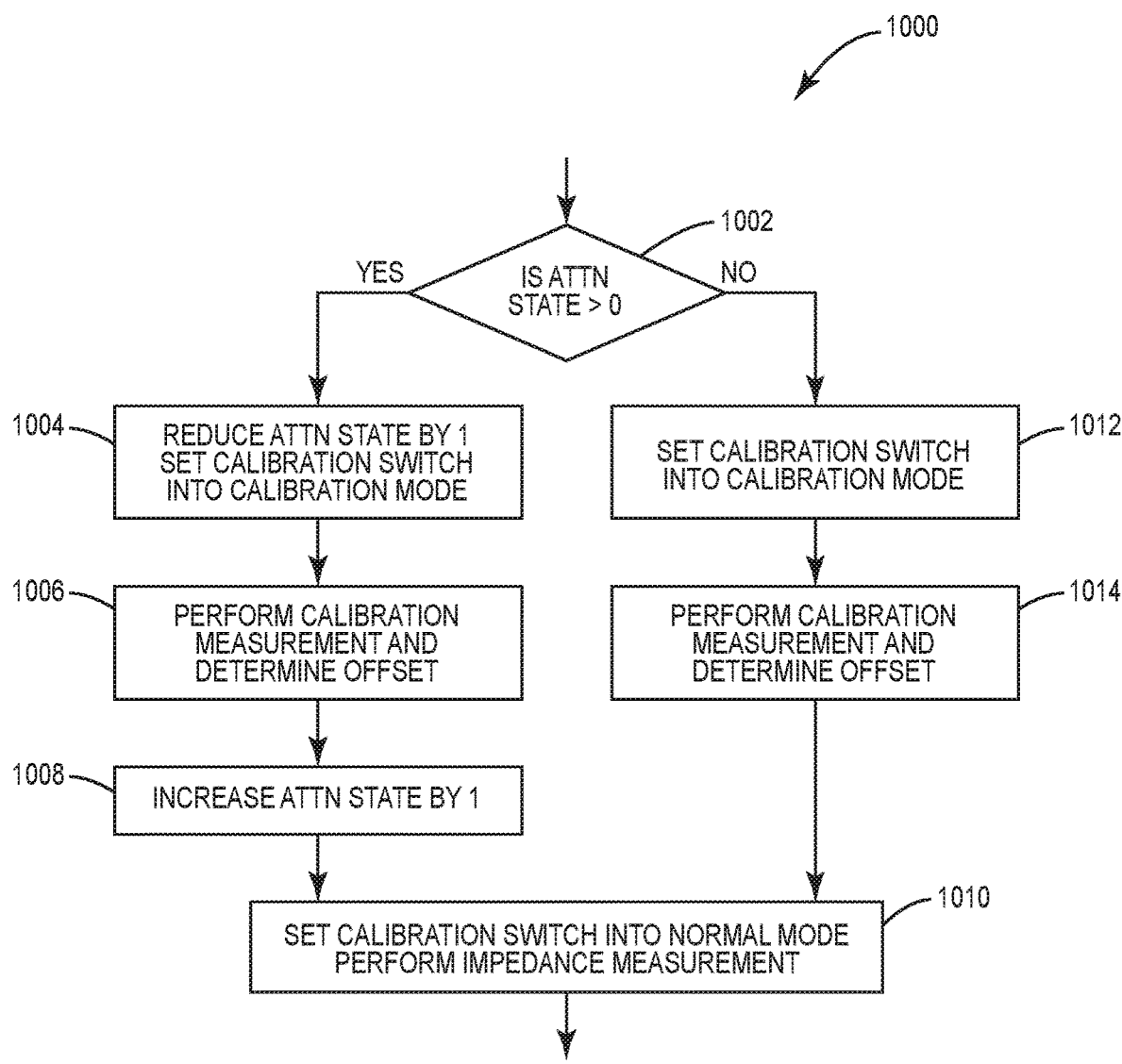
FIG. 10 is a flowchart illustrating an exemplary process for implementation of an attenuator change during calibration measurement.

One way the attenuation may be set is shown by a flowchart of a process 1000 in FIG. 10. The process 1000 begins by determining if the current attenuation state of the dual programmable attenuator circuit 510 is greater than zero (block 1002). If the answer to block 1002 is yes, then a control circuit such as the control circuit 522 may reduce the attenuation state by one step and set the calibration switch 508 into calibration mode (block 1004) such as by turning the appropriate switches on and off. The process 1000 continues by performing a calibration measurement and determining an offset (block 1006). The attenuation state is then increased by one step (block 1008), and the control circuit 522 sets the calibration switch 508 into a normal mode and performs an impedance measurement (block 1010).

If, however, the answer to block 1002 is no, the current attenuation state is not greater than zero, then the control circuit 522 may set the calibration switch 508 into calibration mode (block 1012) and perform a calibration measurement to determine offset (block 1014). The control circuit 522 then sets the calibration switch 508 into a normal mode and performs an impedance measurement (block 1010).

In an exemplary aspect, the dual programmable attenuator circuit 510 may move in 5 dB steps based as it moves through steps (i.e., 5 dB is close to 4.5 dB discussed above as being the loss from signal splitting and mismatch). Further, the dual programmable attenuator circuit 510 may operate with attenuation between 0 and 25 dB.

Exemplary aspects of the present disclosure provide further methods for adaptively controlling the dual programmable attenuator circuit 510 for high dynamic range of operation. In a primary automatic gain control (AGC) mode, a single power measurement is made, and the dual programmable attenuator circuit 510 is set once to target a detected signal level of POWER_TARGET based on a slope parameter for the selected band of operation. This selection is used to extend a dynamic range of the power detectors to accommodate a wide range of transmit signal powers. The AGC process is done before self-calibration and gamma measurements to set the best detector dynamic range.

In an exemplary aspect, a fast mode attenuator setting for the dual programmable attenuator circuit 510 is computed using an equation:

$$\text{ATTN}:=\text{floor}(\text{ATTNC}+0.1875*\text{SLP\_FWD}*(\text{FWD-POWER\_TARGET})+0.5)$$

The value ATTNC is the setting used for the power measurement of the FWD signal. This setting is used to target the desired power level of POWER_TARGET in ADC least significant bits (LSB) units. After computing the new ATTN value, the MIN value may be limited to be in the range of 0 to 5. The dynamic range of the system may be expanded by increasing the number of ATTN steps or increasing the step size of the steps in dB, The precision of the level control may be increased by decreasing the ATTN step size in dB. The same algorithms for selecting the ATTN value may be used with appropriate modification of the ATTN limits and the scaling in the update equation.

Figure 11:
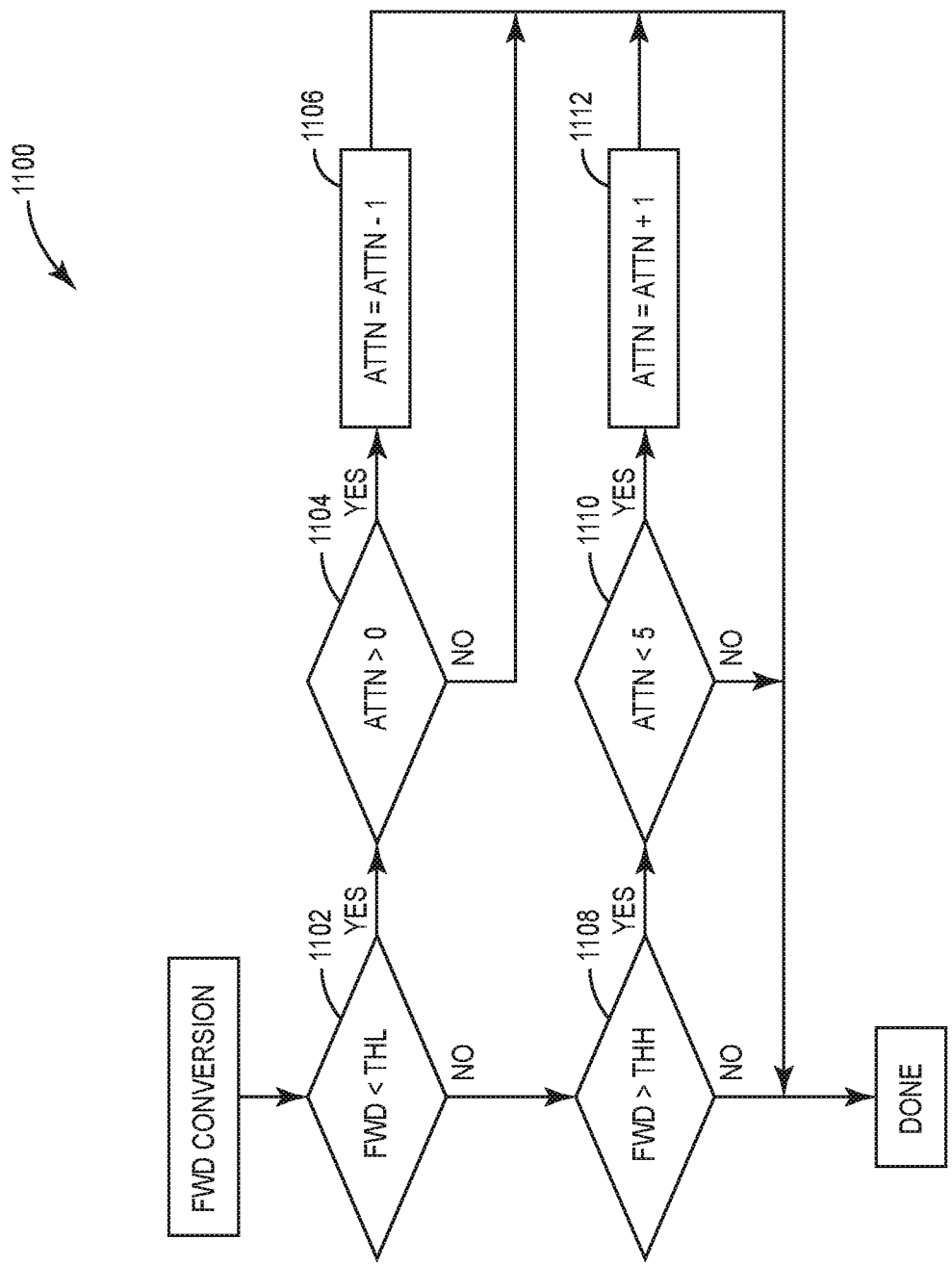
FIG. 11 is a flowchart showing a single-step automatic gain control sequence used to determine whether to increase or decrease the attenuation setting.

An alternate mode is a single step (slow) mode which also seeks to adjust ATTN to achieve the POWER_TARGET FWD detector output. The single step AGC sequency may be used to determine whether to increase or decrease the attenuation setting—ATTN based on the power measurement and its comparative value with POWER_TARGET. A flowchart of a process 1100 is provided with reference to FIG. 11.

In this regard, the process 1100 begins with a determination of whether the FWD signal is less than a lower threshold (block 1102). In an exemplary aspect, the lower threshold may be set to THL=POWER_TARGET−ATTN_step/2. If the answer to block 1102 is yes, the FWD signal is less than the threshold, the process 1100 determines whether the attenuation state is greater than zero (block 1104). If the attenuation state is greater than zero, then the process 1100 decrements the attenuation state by one (block 1106). If the attenuation state is zero, then process 1100 ends because the attenuation state cannot be lowered further.

If, however, the answer to block 1102 is no, the process 1100 determines if the FWD signal is greater than a high threshold (block 1108). In exemplary aspect, the high threshold may be set to TRH=POWER_TARGET+ATTN_step/2. If the answer to block 1108 is no, then the process 1100 ends. If, however, the answer to block 1108 is yes, the FWD signal is greater than the high threshold, the process 1100 determines if the attenuation state is less than five (block 1110). If the answer to block 1110 is no, then process 1100 ends because the attenuation state cannot be further incremented. If the answer to block 1110 is yes, then the attenuation state is incremented by one (block 1112), and the process 1100 ends.

It should be appreciated that performing impedance matching and using the dual-direction coupler 502 consumes power. While power consumption may not be of concern for some devices, most devices, and particularly mobile communication devices, are under pressure to reduce power consumption wherever possible. Accordingly, exemplary aspects of the present disclosure contemplate that portions of the impedance sensor die 500 may be put into low-power modes or otherwise be inactive when not being used. Accordingly, the SPD circuit 516 may be used to detect a signal, and based on whether the signal exceeds a threshold, activate other portions of the impedance sensor die 500.

Signal power may be detected with an envelope detector and a comparator (neither shown) on the FWD output of the dual-direction coupler 502. The detector offset may initially be calibrated with the no RF signal present. Once the detection threshold is set, the comparator output is fed to the control circuit 522 to qualify a signal detection. The signal qualification may be digital and may have different modes to help detect transmitted signals. When a qualified signal is detected, the measurement sequence is initiated.

The comparator may have a threshold controlled by a digital-to-analog converter (DAC) (not shown). This DAC is controlled by the control circuit 522 and set at the calibration time before signal detection. When an RF signal is switched off at the detector, the control circuit 522 applies the minimum offset to the comparator offset DAC to cause the comparator to trigger. The control circuit 522 then raises the offset one LSB at a time until the comparator drops (i.e., the comparator fails to trigger a detection). Finally, a negative offset may be applied to set a nominal power level as the detection threshold for use when an RF signal is applied. This calibration removes a comparator circuit offset which may arise from process, supply, and/or temperature variation.

Debounce of the comparator (i.e., prevention of the comparator running too many times) is performed to reject short duration noise impulses. The SPD circuit 516 only passes signals Which are longer than a set duration (e.g., D_B). In a contemplated aspect, D_B is approximately 0.5 microseconds (μs) at first bandwidths up to 5 μs at second bandwidths. As used herein approximately is within five percent.

In an exemplary aspect, rising edge detection may be used to initiate a measurement near the beginning of a pulse signal. This detection helps avoid making a measurement that continues after the signal pulse ends, which might give a noisy or invalid result. When initiating the SPD circuit 516 in Edge_Detect mode, the SPD circuit 516 first waits for a period of low-signal power. This period indicates that the transmitter is inactive. In an exemplary aspect, the SPD circuit 516 waits for 100 μs. Then, the SPD circuit 516 is ready to trigger a measurement of when the next qualified detection occurs.

In an exemplary aspect, implementation of Edge_Detect mode may also have an override condition which allows a measurement to be triggered if the SPD circuit 516 continues to show a signal present for more than a threshold (e.g., 10 milliseconds (ms)). This way, a transmit signal that is full duty cycle can override the Edge_Detect mode and still trigger a measurement.

The SPD circuit 516 uses much less current than other detection circuitry, which allows for low battery draw while waiting for a transmit signal to be present. The SPD circuit 516 may set a status flag or flag bits if a signal was detected and/or if a valid measurement was completed.

Figure 12:
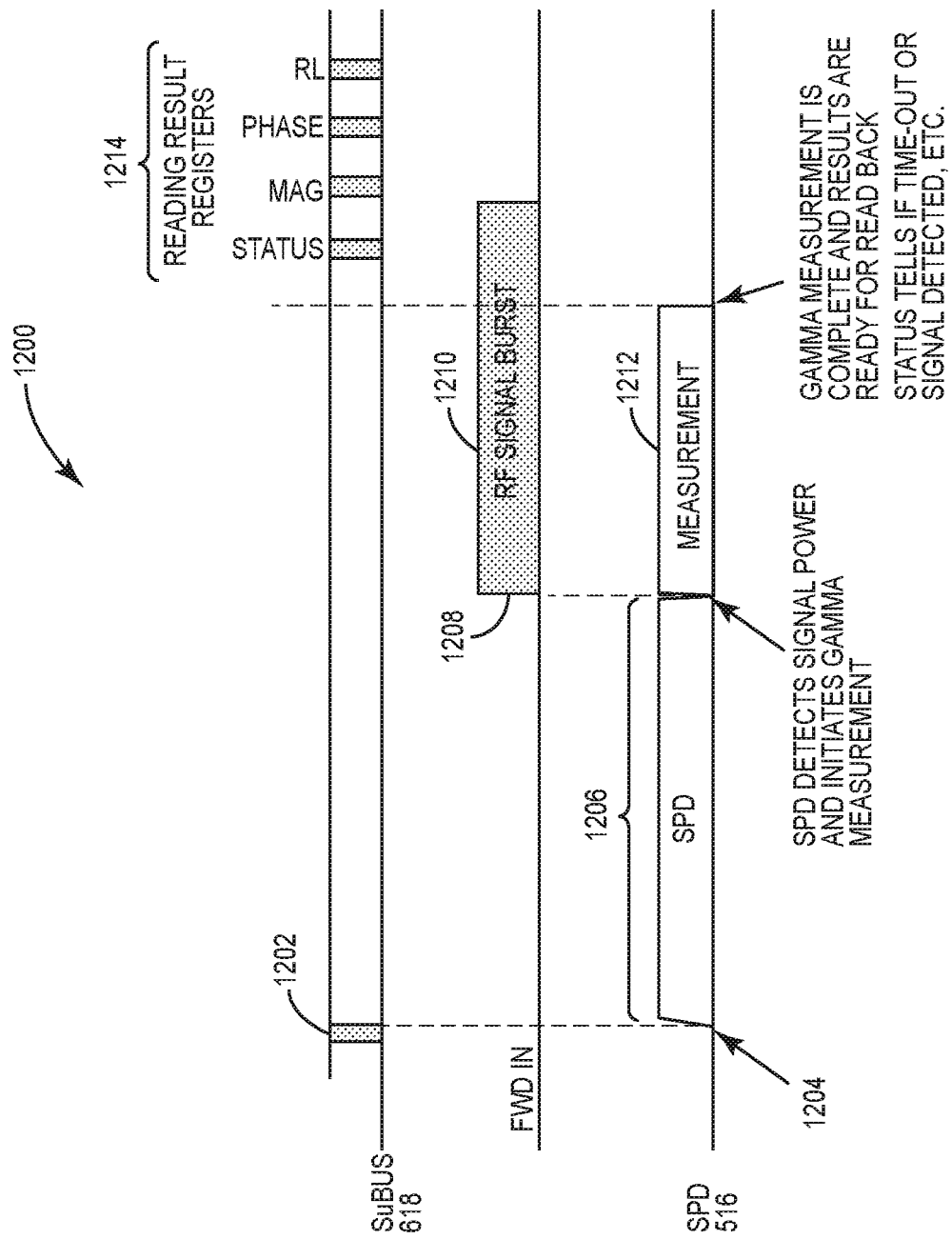
FIG. 12 is a signal diagram showing operation of a signal power detector circuit in measurement mode.

Operation of the SPD circuit 516 is illustrated by signal chart 1200 in FIG. 12. A signal 1202 on the bus 618 causes the SPD circuit 516 to turn on at point 1204. The activation of the SPD circuit 516 causes the SPD circuit 516 to run until a signal is detected or a time-out reached. Thus, the SPD circuit 516 remains on during window 1206. At time 1208, an RF signal burst 1210 arrives at the dual-direction coupler 502 and particularly on the FWD input thereof. The SPD circuit 516 takes a measurement 1212 and stores it in a register. The values of the registers may be sent over the bus 618 (generally at 1214).

Figure 13:
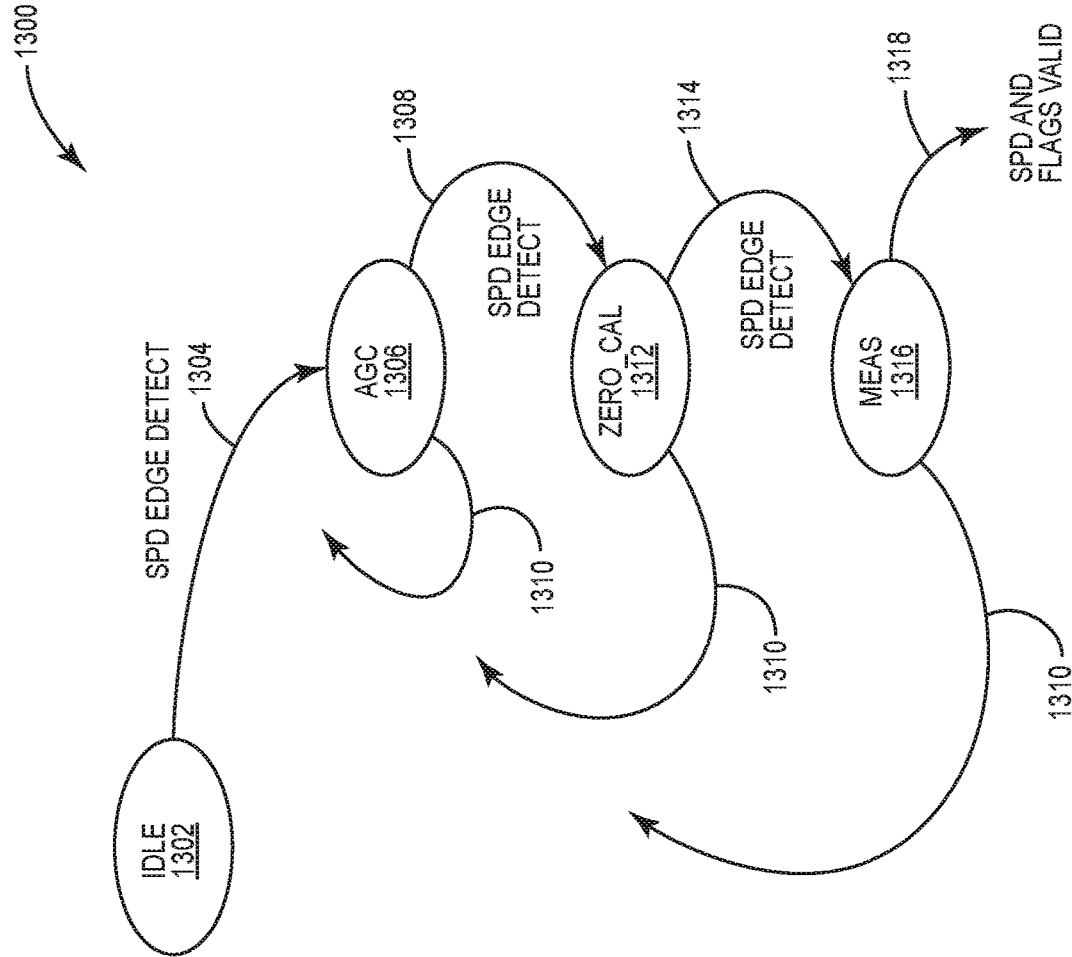
FIG. 13 is a state diagram of the signal power detector circuit as it processes through a multiple-burst-mode measurement sequence.

A state diagram 1300 of the SPD circuit 516 for multiple burst mode is provided with reference to FIG. 13. Multiple burse mode allows measurements on short bursts including 60 kHz SCS SRS-only type waveforms. In particular, the SPD circuit 516 begins in an idle mode 1302 until an edge detection event occurs (line 1304). The SPD circuit 516 operates in an automatic gain control mode 1306 until there is another edge detected (line 1308) or a time out occurs (measurement invalid) (line 1310). If an edge is detected during the automatic gain control mode 1306, then the SPD circuit 516 zeroes the calibration at state 1312. The SPD circuit 516 stays in state 1312 until an edge detection event occurs (line 1314) or a time out occurs (line 1310). If an edge is detected during the state 1312, a measurement is taken at state 1316 or a time out occurs (line 1310). After the measurement is taken, the SPD circuit 516 sets the flags as valid (line 1318).

While it is possible that the transceiver and baseband IC 602 or the smart bridge IC 714 provides incoming frequency information, in a further exemplary aspect, the impedance sensor die 500 may perform incoming carrier frequency detection and make automatic adjustments based thereon. In particular, a transmit signal frequency may be measured by a frequency counter on the FWD coupler output. This counter counts the number of zero crossings in the signal over a known time interval (e.g., 1 ms). This count is proportional to the average signal frequency. This frequency information may be used to optimize subsequent impedance measurements.

In an exemplary aspect, the frequency counter has three main parts: a pre-scaler which divides the signal cycle counts by a power of two (e.g., 2, 4, or 8); a calibrated clock which controls the count interval to give an accurate frequency measurement; and a digital counter which counts the pre-scaled cycles to give the final frequency value.

The frequency derived from the counter is used to validate a signal by checking that the signal is in the right band or range. For example, the frequency could show if the measurement was from a WiFi or a cellular signal. When multiple transmit signals are present, the frequency derived from the counter can be used to sort measurements by which the signal was detected.

The frequency can also be measured in the REV path. If the frequency in the REV path does not match the frequency in the FWD path, this mismatch indicates that the REV path has interference from another antenna or device. It should be appreciated that this sort of interference and validity check correlates to accurateness based on the size of the REV power (i.e., the REV power has to be sufficiently large to generate an appropriate signal).

The frequency information may also be used to select the coupler band and RF filter settings. That is, initially, the signal power and frequency are measured. Then that frequency may be used to select the band for the coupler terminations in the coupler matching circuit 506. Also, the RF filter can be set to reject other out-of-band signals.

If there are transmit signals at two different bands present, then two measurements may be made. The first measurement may be made with the RF filter set as a low-pass filter, and the second measurement may be made with the RF filter set as a high-pass filter. Such repeated measurements allow for separation of the signals such that individual power and frequency of each signal may be determined. If desired, each of the two signals can be used for impedance measurement where the RF filter selects the signal, each in turn.

In the event that a signal's frequency does not match a known transmit frequency or band, the measurement may be discarded or ignored. Commonly, this out-of-band signal may occur when a signal is detected from a different antenna or device. Alternatively, this out-of-band signal may occur when two signals arrive concurrently and cause a miscount by the counter.

In a further exemplary aspect, the signal frequency may be used to optimize the compensation parameters. For example, detector amplitude modulation and/or phase modulation and complex offset can vary with frequency. The measured signal frequency may be used to interpolate between a small set of values to give compensation optimized for the actual frequency. The knowledge of the frequency may also be used to apply to the coupler termination values if the DAC precision is sufficiently high.

In a further exemplary aspect, the signal frequency may also be used to guide autonomous tuning of the antenna impedance. The impedance measurement may be used to select and/or compute new tuning settings based on a tuning algorithm. The signal frequency may also be used to qualify a measurement for use by the tuning algorithm. Further, the algorithm may also use the frequency measurement to adjust the tuning update based on look-up tables and/or calculations such as interpolation or the like.

It should be appreciated that several of the circuits used in the impedance sensor die 500 may suffer from performance change/drift with ambient temperature. A large temperature difference compared with the production test calibration temperature may thus cause degraded accuracy in the estimated antenna impedance. In a further exemplary aspect of the present disclosure, an integrated temperature sensor 534 may be used and read by an ADC during run-time calibration. The estimated run-time temperature is then used to modify production calibration settings and/or the algorithms involved in the calculation of the estimated impedance. The temperature sensor 534 may be offset calibrated during production test calibration by reading its value at the ambient temperature used during production test calibration and storing its value in non-volatile memory such as efuses 526.

One example of run-time temperature compensation is the temperature-dependent compensation of the resistive coupler terminations settings. The resistive coupler terminations are important to the directivity of the dual-direction coupler 502 and thus impact the impedance estimation accuracy. Temperature drift in metal resistivity of the secondary coupler traces and in the coupler terminations causes a change in the coupler directivity when ambient temperature deviates from the calibration temperature. This change can be counteracted by adjusting the termination resistor setting based on temperature according to the following equation:

$$R\text{TERM}=R\text{TERM\_CAL}+(\text{TEMP\_RD}-\text{TEMP\_RD\_CAL})*R\text{TERM\_TEMP\_COEF}$$

where:
  RTERM is the termination resistor setting applied during a measurement.
  RTERM_CAL is the termination resistor setting found during production test calibration.
  TEMP_RD is the run time temperature sensor read back.
  TEMP_RD_CAL is the temperature sensor read back during production test calibration.
  RTERM_TEMP_COEF is an empirically determined correction coefficient that scales the required change in the RTERM setting based on the temperature difference sensed during run-time and the production test conditions.

Figure 14:
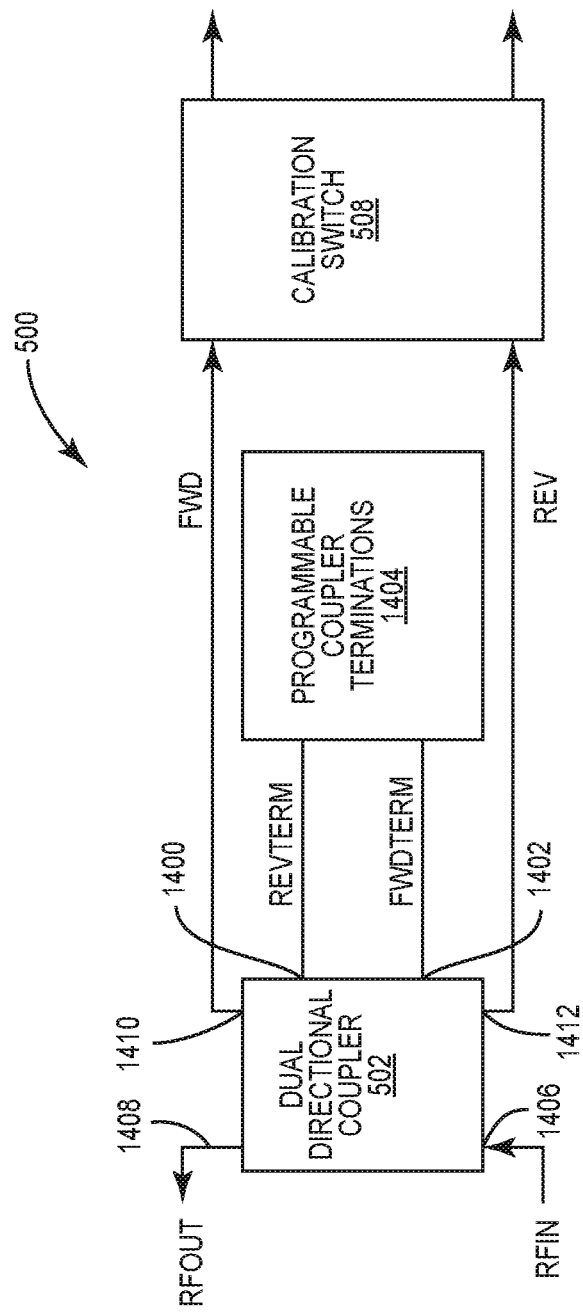
FIG. 14 is a block diagram of the dual-direction coupler used in the impedance sensor die of the present disclosure.

Similarly, as described previously, the temperature sensor 534 can be used to temperature compensate other settings and algorithms in the impedance sensor die 500:

Capacitive coupler termination setting
Power detector slopes and biasing
AM/PM correction factors
Phase detection algorithm In the impedance sensor die 500, the dual-direction coupler 502 is used as the sensing device. The dual-direction coupler 502 provides a FWD-coupled signal and a REV-coupled signal that are proportional to the forward and reverse traveling wave components in the transmission path. From the power and phase offsets of the FWD and REV signals, the load reflection coefficient can be determined. The dual-direction coupler 502 has four ports as better illustrated in FIG. 14. Specifically, the dual-direction coupler 502 has output ports 1400 (FWDTERM) and 1402 (REVTERM), that are terminated in load impedances. To calibrate the coupler directivity for fabrication tolerances and versus frequency, these load impedances are programmable and may be found in a programmable coupler termination circuit 1404. The coupler terminations are typically implemented as parallel resistor (RTERM) and capacitor (CTERM) banks that are switched in and out. The FWD- and REV-coupled signals from ports 1410, 1412 are connected to the calibration switch 508 that is used in measurement calibration.

The insertion loss of the directional coupler from RFIN 1406 to RFOUT 1408 can broadly be viewed as coming from two sources: (1) losses in the primary side of the dual-direction coupler 502 and (2) coupling losses coming from the signal energy of the FWD and REV signals being dissipated in other places in the circuitry, primarily in the power detectors. Since the coupling factor typically decreases with 6 dB per octave, the coupling loss is much more pronounced at higher frequencies.

In an exemplary aspect, a method of reducing the coupling losses when the impedance sensor is not actively sensing is used. Since the impedance sensor die 500 is expected to be operating at a very low duty cycle, this low insertion loss mode can be applied most of the time.

In a first method, when the impedance sensor die 500 is not actively sensing, the coupler terminations within the programmable coupler termination circuit 1404 are disconnected, leaving ports 1400, 1402 in a high impedance state. In addition, the calibration switch 508 is put into an open circuit state, terminating ports 1410, 1412 with high impedance open connections. Accordingly, coupling loss is reduced significantly.

This first method is effective at reducing the coupling loss. However, this first method also has RF voltage levels on the ports 1400, 1402, 1410, 1412 that can get quite high. The voltage levels rise because there is a capacitive voltage divider between the primary to secondary trace capacitance and the off capacitance of the switches in the coupler termination and the calibration switch. The high voltage level requires that the switches in the programmable coupler termination circuit 1404 and in the calibration switch 508 have a corresponding high voltage handling level, both for reliability and linearity reasons. Such robustness increases costs, but may be appropriate in some instances.

Instead of opening all switches in the programmable coupler termination circuit 1404, a second possible method opens the switches to the resistive termination bank within the programmable coupler termination circuit 1404, but turns on all the switches in the capacitive termination bank within the programmable coupler termination circuit 1404 to achieve the maximum value of CTERM. When CTERM is at a maximum, the ports 1400, 1402 are terminated into capacitive terminations, and the aforementioned capacitive voltage divider now results in a lower voltage level on the ports 1400, 1402, 1410, 1412. The calibration switch 508 is still put into an open circuit state, terminating ports 1410, 1412 into high impedance open connections. If the maximum value of CTERM is not adequate, a larger switchable capacitance can be added to the CTERM bank for this specific purpose.

It should be appreciated that the digital representation of the measured impedance may be modified by correction factors that compensate for known errors in the system. These corrections may be the same for each unit or may be programmed into an electric fuse during production calibration.

When the detector circuits 514, 518 amplify the signal being measured, they can introduce phase shifts that depend on the power level. Since the FWD and REV paths have different power levels, depending on the load return loss, this can lead to a phase error in the impedance measurement, which varies with the return loss. Accordingly, an Amplitude Modulation and/or Phase Modulation (AM/PM) compensation can be used to reduce the error in the final result.

In an exemplary aspect, the AM/PM compensation may be performed in the control circuit 522 or in the detector circuits 514, 518 and is given by the following:

$$PhaseAMPM = MAG*AP1$$

where MAG is the reflection coefficient magnitude, and AP1 is the AM/PM scaling factor, which could be positive or negative. This type of phase correction can be extended to higher order polynomials, for example:

$$PhaseAMPM = MAG*AP1 + MAG*MAG*AP2 + MAG*MAG*MAG*AP3$$

Alternatively, the AM/PM compensation can be done using the RL value in decibel log units. In this case:

$$PhaseAMPM = RL*AP1 + RL*RL*AP2 + RL*RL*RL*AP3$$

However, when RL is large, the phase accuracy degrades due to the small REV power. So, if using RL for AM/PM compensation, the RL should be limited to some maximum level, for example, RL_max=10 dB.

The errors in the coupler-termination sensing system can lead to an offset in the estimated complex reflection coefficient. The repeatable part of this offset can be measured at production and compensated by subtracting a possibly frequency-dependent complex value. The measured magnitude and phase of gamma are first converted to rectangular coordinates (using a technique such as the CORDIC, or coordinate rotation digital computer), and the offset is applied. The compensated value is then converted back to polar coordinate magnitude and phase (using a technique such as CORDIC).

The compensation of MAG/Phase is expressed as follows:

$$Re/Im = CORDIC\_PR(MAG, Phase)$$

$$Re\_C/Im\_C = Re + Comp\_R/Im + Comp\_I$$

$$MAG\_C/Phase\_C = CORDIC\_RP(Re\_C/Im\_C)$$

where CORDIC_PR( ) performs the conversion from polar to rectangular coordinates and CORDIC_RP( ) performs the conversion from rectangular to polar coordinates.

Figure 1B:
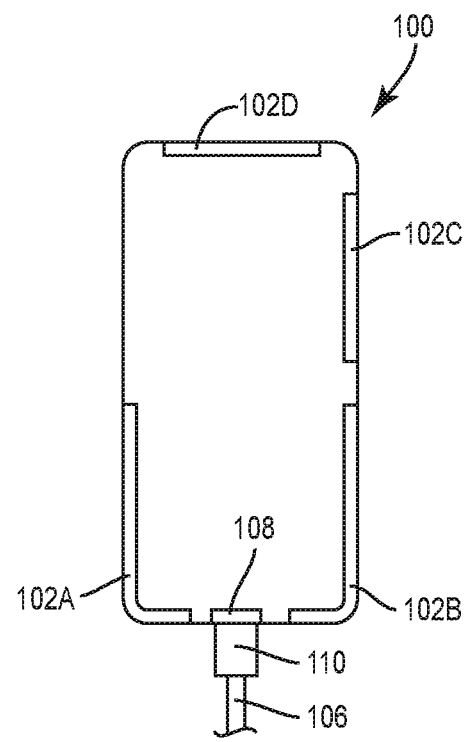
FIGS. 1B-1D illustrate the mobile communication device of FIG. 1A in various situations where environmental factors may affect the impedance of one or more of the multiple antennas in the mobile communication device.
Figure 1C:
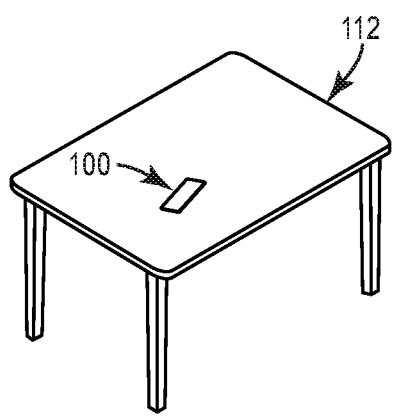
Figure 1D:

It should be appreciated that, as illustrated in FIGS. 1A and 1B, a mobile communication device 100 may include multiple antennas 102A-102D (or more). In an exemplary aspect, each of the multiple antennas 102A-102D may have a respective impedance sensor die 500 and associated tuner. The impedance sensor dies 500 and tuners may operate in either a closed loop or open loop controlled fashion. It should further be appreciated that having multiple impedance sensor dies 500 can impose a significant impact on the amount of current used by the mobile communication device 100.

Figure 15A:
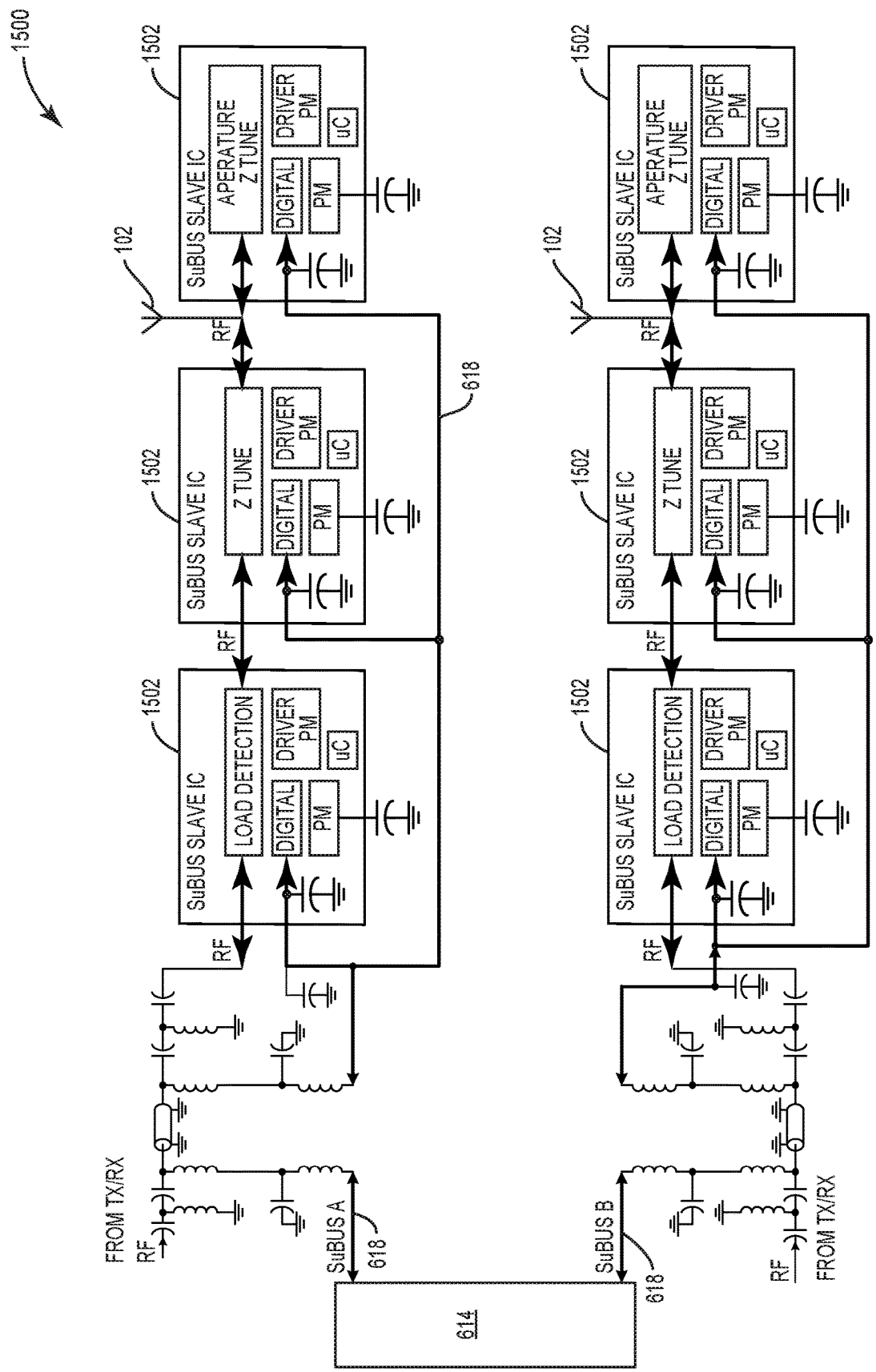
FIGS. 15A and 15B are a schematic showing an example antenna system architecture according to the present disclosure.
Figure 15B:
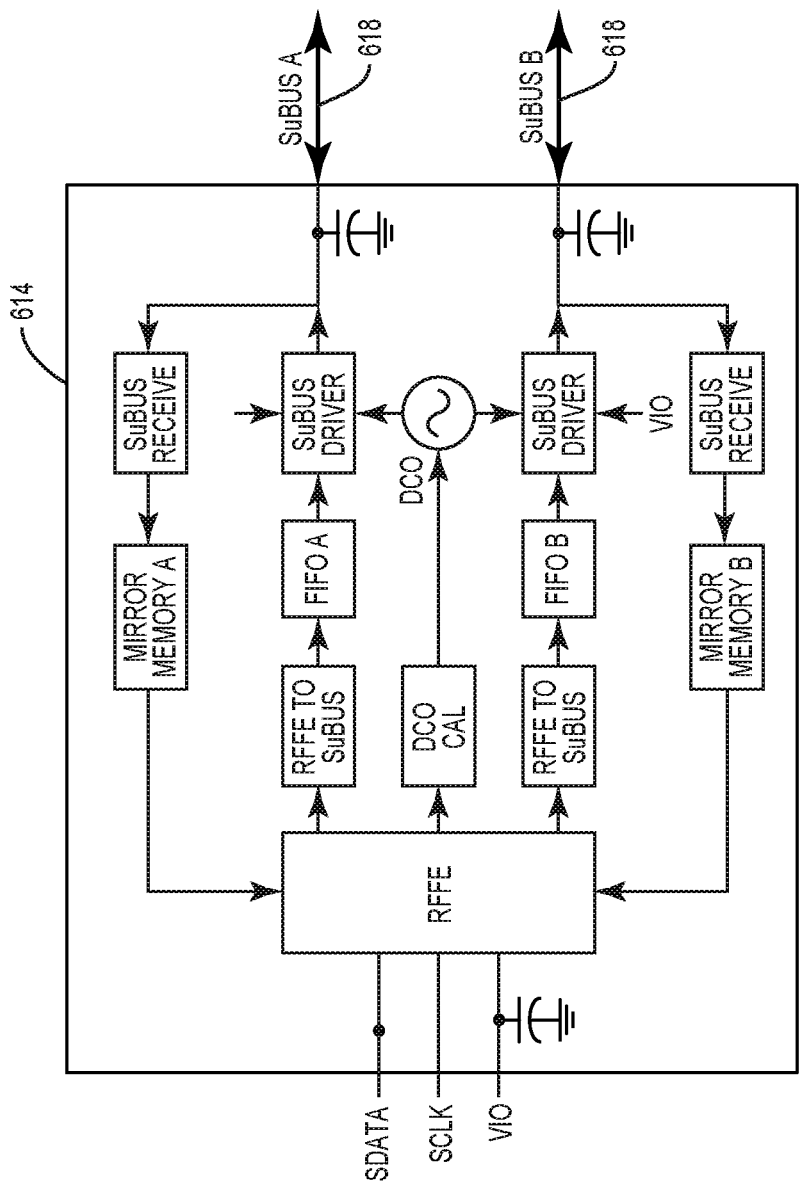

FIGS. 15A and 15B show a hybrid circuit-block diagram of an exemplary antenna system 1500 for use in a mobile communication device 100. The system 1500 may use a single-wire supply and directional serial bus 618 with a bridge IC 614 and multiple RF silicon-on-insulator (RFSOI) antenna tuners 1502 used on a single antenna 102 for the purpose of impedance sensing, impedance tuning, and aperture tuning.

While only two antennas 102 are illustrated, a typical phone antenna architecture design may have one or two bridge ICs 614 with as many as 12 RFSOI antenna tuners 1502 used to tune a number of antennas 102 for various band combinations and environmental conditions. In exemplary aspects, there are different scenarios (band combinations, power, environmental conditions, and/or other system considerations) Which optimum performance for each individual antenna tuner 1502 in the architecture may be more or less important. The use of the impedance sensor die 500 provides this flexibility.

In exemplary aspects, reconfigurable antenna tuners 1502 may have a register programmable low current mode (lcm) and an impedance sensor die 500 with the same register programmable lcm that also has frequency detection capability and measurement performance versus current modes. These modes and reconfigurability allow for the antenna architecture system design to make dynamic trade-offs between radiated efficiency and battery efficiency.

As described above, the impedance sensor die 500 can first detect the frequency of the incoming carrier, update the calibrations, and make an accurate measurement (with the information of the frequency, the impedance sensor die 500 can utilize a lower current mode to make the measurement if appropriate). This information can be used to actively adjust the impedance sensor measurement and standby current and the modes of the antenna tuners 1502 on the antenna 102 to make the appropriate battery versus radiated efficiency decision.

Figure 16:
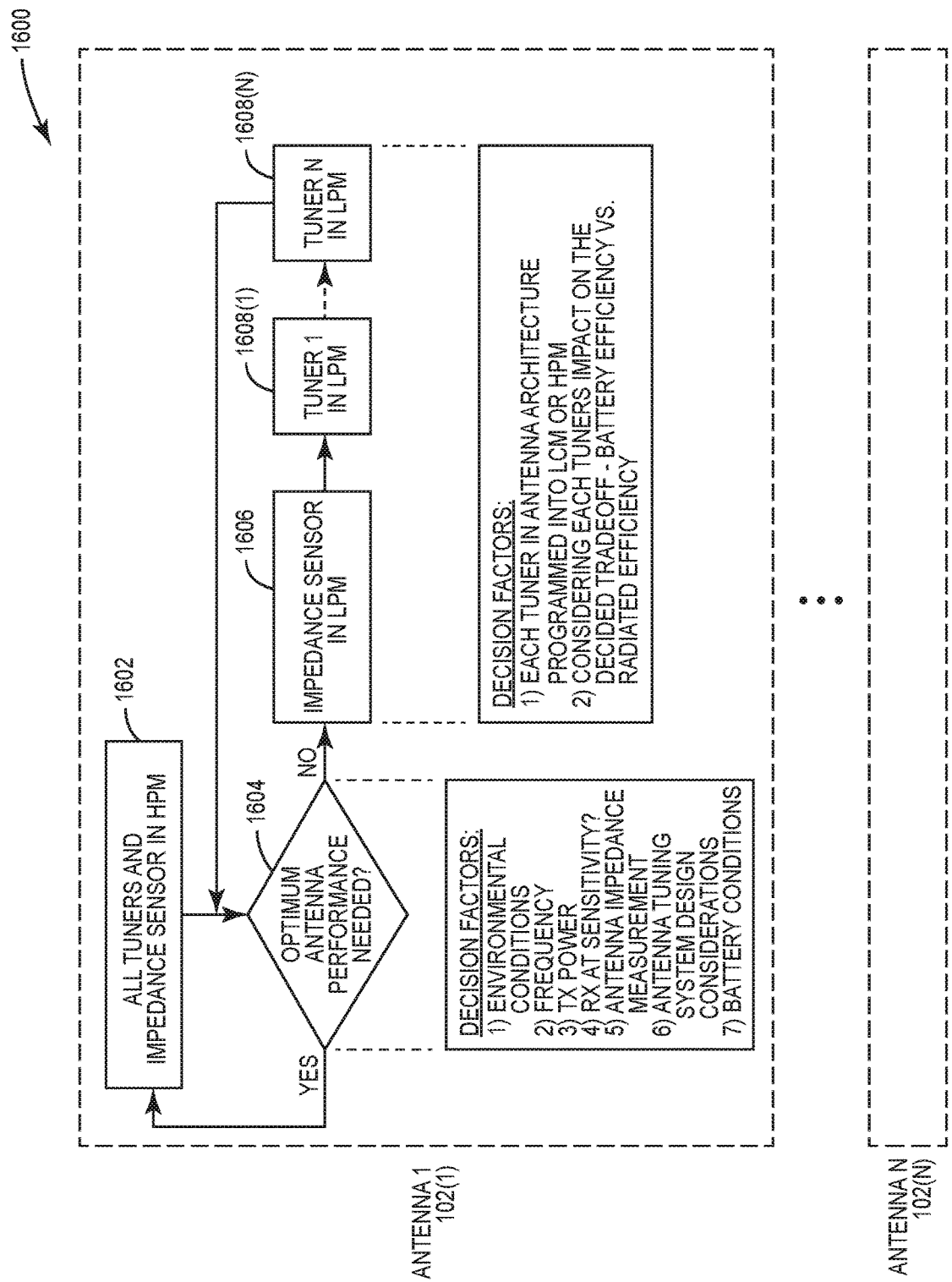
FIG. 16 is a flowchart showing an example decision matrix for the system of FIG. 15 including multiple antennas.

FIG. 16 provides a flowchart of a decision process 1600 that is used by each of the antennas 102A-102D. Initially, all tuners and the impedance sensor die 500 are in a high-power mode (RPM) (block 1602). The control circuit 522 or the intelligence in the transceiver and baseband IC 602 or the smart bridge IC 714 determines whether optimum antenna performance is needed (block 1604). If the answer is no, then the intelligence may place the impedance sensor die 500 in a low current or low power mode (block 1606) and then place the antenna tuners 1502 in low current or low power modes (blocks 1608(1)-1608(N)). If the answer to block 1604 is yes, then the process 1600 iterates as noted. Various decision factors for block 1604 include, but are not limited to: environmental conditions, frequency, transmit power, receiver sensitivity, antenna impedance measurement, antenna tuning system design considerations, and battery condition. Further the low current mode decision may be made independently and may consider each tuner's impact on the battery efficiency versus radiated efficiency or other factors as needed or desired.

It should be appreciated that the transmit signal environment can be quite dynamic with changes in signal power, duty cycle, and bandwidth. Also, one antenna 102 may have transmit signals from different bands and services, for example, cell, WiFi, and BlueTooth. The different bands and services may have different signal parameters, which may amount to requirements to operate in that band or using that service. Accordingly, it is desirable to verify that key signal parameters are within an acceptable range for making an accurate gamma measurement. Exemplary aspects of the present disclosure provide checks to verify signal power, tail power, and SPD detection.

A first status bit (named herein an FPR status bit for forward power rate) may indicate a low power during the gamma measurement. When such bit is set, a threshold in the SPD circuit 516 may be set to a little lower than the minimum expected signal FWD power. When the FPR status bit is set, the measurement may be discarded as possibly invalid. If the FPR status bit is set, the next measurement may use a lower ATTNC value to possibly give a lower ATTN value from automatic gain control and increasing the detected FWD power.

A second status bit (named herein an FPT status bit for forward power tail) may indicate a low signal power in the tail measurement. The tail measurement is performed just after the gamma measurement to check that the signal power is still present. If this tail power is below the low-power threshold, the FPT status bit is set which indicates that the tail power is low and that the gamma measurement may be invalid. The tail power can be low if the signal pulse is shorter than the full gamma measurement sequence duration. If the FPT status bit is set, the next measurement may use a higher measurement bandwidth setting to shorten the measurement sequence duration.

A third status bit (named herein an SPD_TO status bit) may indicate that the SPD circuit 516 timed out during detection search. This indicates that no measurement was made due to lack of signal. In this case, the gamma measurement result values are invalid as well.

A fourth status bit (named herein an FPP status bit) may be set when the peak-to-peak difference of FWD values in zero-cal, gamma, and tail are above a threshold. This indicates that the signal power is varying more than expected. In this case, the next measurement may use a lower measurement bandwidth setting.

The reactions to status bits can be made automatic. For example, if a repeat until valid mode is enabled, then gamma measurements are repeated until a measurement with a valid status is made. Also, if the automatic parameter mode is enabled, bandwidth and ATTNC are changed automatically as described previously.

As noted above, the impedance sensor die 500 can be controlled by a single-wire bus 618 with power supply. However, other devices can be using the same wire for control as well. Since the impedance sensor die 500 draws a high current from the wire during the measurement sequence, other devices cannot communicate over the bus 618 during a sensor measurement. There are various ways this can work.

One method is for the bus controller in the transceiver and baseband IC 602 or the smart bridge IC 714 to inhibit IO to devices while waiting for a pending sensor measurement. For example, the controller sends the command to initiate a measurement with the SPD circuit 516. Then the controller waits for the SPD circuit 516 time out to be complete while stopping all IO on the single-wire bus 618. After the time out delay, the controller reads back the sensor status and result values.

Another method is to allow some IO signaling on the bus 618 and to detect when the signaling interrupts current going to a sensor measurement. A comparator is used to detect current going away from the sensor supply capacitor during an active measurement sequence. This occurs if the sensor sequence is active and the bus 618 is pulled low by the controller for IO signaling. In this case, the sensor measurement is halted, and a status bit is set to indicate the reverse current detect (RCD) state. This allows the controller to use the bus 618 for IO while waiting for an SPD circuit 516 time out. If the RCD state occurs, the controller re-initiates the measurement.

Still another option is to allow a special interrupt signal to be specified for the bus 618 to tell the controller that a sensor measurement sequence begins. This signal is sent by the impedance sensor die 500 when the SPD circuit 516 detects a signal and is initiating a measurement. This interrupt is received by the controller, which then halts all IO traffic on the bus 618 until the measurement is complete. When the impedance sensor die 500 is done with its measurement sequence, it sends a different interrupt signal to the controller, which then resumes normal IO traffic. Using this method, the bus 618 is efficiently shared with other devices with minimal interference from the sensor measurements.

The systems and methods for impedance matching according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. An impedance sensor die comprising:
    a bus interface configured to be coupled to a single-wire bus that provides signaling and power to the impedance sensor die;
    an internal control bus;
    a controller coupled to the internal control bus;
    a dual-direction coupler coupled to the internal control bus, the dual-direction coupler comprising four ports including a forward in, a reverse in, a forward out, and a reverse out;
    a coupler matching circuit comprising programmable load impedances coupled to the dual-direction coupler;
    a calibration switch coupled to the dual-direction coupler and the internal control bus;
    an attenuator circuit coupled to the calibration switch and the internal control bus;
    a memory coupled to the controller;
    a power detector coupled to the internal control bus and configured to measure power for a signal from the dual-direction coupler; and
    a phase detector coupled to the internal control bus and configured to measure a phase for the signal from the dual-direction coupler.

2. The impedance sensor die of claim 1, wherein the controller is configured to determine an impedance based on measurements from the power detector and the phase detector and output a control signal to an impedance tuning circuit.

3. The impedance sensor die of claim 2, wherein the attenuator circuit is configured to calculate an attenuation based on a power measurement from the power detector.

4. The impedance sensor die of claim 3, wherein the attenuator circuit is configured to compare the power measurement to a low threshold and reduce attenuation provided when the power measurement is below the low threshold.

5. The impedance sensor die of claim 3, wherein the attenuator circuit is configured to compare the power measurement to a high threshold and increase attenuation when the power measurement is above the high threshold.

6. The impedance sensor die of claim 1, wherein the memory comprises a plurality of efuses.

7. The impedance sensor die of claim 1, further comprising a low-pass filter and a high-pass filter coupled to the attenuator circuit.

8. The impedance sensor die of claim 1, further comprising a signal power detector circuit configured to detect a power signal and activate the power detector when the power signal is above a threshold.

9. The impedance sensor die of claim 8, wherein the controller is configured to activate the signal power detector circuit based on a signal from the single-wire bus.

10. The impedance sensor die of claim 9, wherein the signal power detector circuit is configured to measure a signal from the dual-direction coupler after activation.

11. The impedance sensor die of claim 10, wherein the signal power detector circuit is configured to time out if the signal from the dual-direction coupler does not exceed a threshold within a predetermined amount of time.

12. The impedance sensor die of claim 8, wherein the signal power detector is further configured to set a status bit.

13. The impedance sensor die of claim 1, further comprising a temperature sensor coupled to the controller, wherein the controller is configured to change terminations in the coupler matching circuit based on a signal from the temperature sensor.

14. The impedance sensor die of claim 1, wherein the calibration switch comprises:
   a forward input and a reverse input;
   a forward output and a reverse output;
   a first switch between the forward input and the forward output; and
   a second switch between the reverse input and the reverse output.

15. The impedance sensor die of claim 1, further comprising a filter coupled to the attenuator circuit.

16. The impedance sensor die of claim 1, wherein the controller is further configured to perform amplitude modulation compensation.

17. The impedance sensor die of claim 1, wherein the controller is further configured to perform phase modulation compensation.

18. The impedance sensor die of claim 1, further comprising a carrier frequency detector circuit comprising a counter configured to derive a count reflective of a frequency, wherein the count is used to generate a frequency measurement.

19. The impedance sensor die of claim 18, wherein the controller is configured to use the frequency measurement to determine information about the signal.

20. The impedance sensor die of claim 19, wherein the information comprises an identification about a reflected signal or a blocking signal.

* * * * *

UNITED STATES PATENT AND TRADEMARK OFFICE
CERTIFICATE OF CORRECTION

PATENT NO. : 11,711,107 B2
APPLICATION NO. : 17/454437
DATED : July 25, 2023
INVENTOR(S) : Christian Rye Iversen et al.

It is certified that error appears in the above-identified patent and that said Letters Patent is hereby corrected as shown below:

In the Specification

In Column 9, Line 53, replace "7061" with --706L--.

In Column 11, Line 25, replace "RE switch" with --RF switch--.

In Column 13, Line 20, replace "the MIN value" with --the ATTN value--.
In Column 13, Line 23, replace "in dB," with --in dB.--.
In Column 13, Line 50, replace "TRH=POWER" with --THH=POWER--.

In Column 19, Line 30, replace "siderations) Which" with --siderations in which--.
In Column 19, Line 55, replace "(RPM)" with --(HPM)--.

In Column 21, Line 6, replace "some 10 signaling" with --some IO signaling--.

Signed and Sealed this
Nineteenth Day of September, 2023

Katherine Kelly Vidal
*Director of the United States Patent and Trademark Office*